US012581946B2

(12) United States Patent
Fukuoka et al.

(10) Patent No.: US 12,581,946 B2
(45) Date of Patent: Mar. 17, 2026

(54) SEMICONDUCTOR DEVICE AND POWER CONVERTER

(71) Applicant: DENSO CORPORATION, Kariya-city (JP)

(72) Inventors: Daisuke Fukuoka, Kariya-city (JP); Hideyuki Uehigashi, Kariya-city (JP); Masayoshi Umezawa, Kariya-city (JP); Masanori Ooshima, Kariya-city (JP); Ryoji Uwataki, Kariya-city (JP); Takahiro Hirano, Seto-city (JP)

(73) Assignee: DENSO CORPORATION, Kariya-city (JP)

( * ) Notice: Subject to any disclaimer, the term of this patent is extended or adjusted under 35 U.S.C. 154(b) by 622 days.

(21) Appl. No.: 17/976,370

(22) Filed: Oct. 28, 2022

(65) Prior Publication Data

US 2023/0040316 A1 Feb. 9, 2023

Related U.S. Application Data

(63) Continuation of application No. PCT/JP2021/010172, filed on Mar. 12, 2021.

(30) Foreign Application Priority Data

May 1, 2020 (JP) ................................. 2020-081437

(51) Int. Cl.
H01L 23/367 (2006.01)
H01L 21/56 (2006.01)
(Continued)

(52) U.S. Cl.
CPC ........ H01L 23/3675 (2013.01); H01L 21/565 (2013.01); H01L 23/3142 (2013.01);
(Continued)

(58) Field of Classification Search
CPC ............. H01L 23/3675; H01L 23/3142; H01L 23/3672; H01L 23/49838; H01L 23/49861;
(Continued)

(56) References Cited

U.S. PATENT DOCUMENTS

2007/0057373 A1 3/2007 Okumura et al.
2019/0057921 A1* 2/2019 Ooshima ............. H01L 23/3142
(Continued)

FOREIGN PATENT DOCUMENTS

JP 2019176058 A 10/2019

*Primary Examiner* — Peniel M Gumedzoe
(74) *Attorney, Agent, or Firm* — Posz Law Group, PLC

(57) ABSTRACT

A semiconductor device includes a semiconductor element, a first wiring member, a second wiring member, and a terminal. The semiconductor element includes a first main electrode and a second main electrode on a side opposite from the first main electrode. The first wiring member is connected to the first main electrode. The terminal has a first terminal surface connected to the second main electrode and a second terminal surface. The second terminal has four sides. Two of the four sides are parallel to a first direction intersecting the thickness direction, and other two sides of the four sides are parallel to a second direction perpendicular to the thickness direction and the first direction. The second wiring member is connected to the second terminal surface of the terminal through solder, and has a groove. The groove overlaps one or two of the four sides of the second terminal surface.

7 Claims, 18 Drawing Sheets

(51) Int. Cl.

| | |
|---|---|
| *H01L 23/00* | (2006.01) |
| *H01L 23/31* | (2006.01) |
| *H01L 23/498* | (2006.01) |
| *H01L 25/065* | (2023.01) |
| *H02M 1/00* | (2007.01) |
| *H02M 3/00* | (2006.01) |
| *H02M 7/00* | (2006.01) |

(52) U.S. Cl.
CPC .... *H01L 23/3672* (2013.01); *H01L 23/49838* (2013.01); *H01L 23/49861* (2013.01); *H01L 23/49894* (2013.01); *H01L 24/32* (2013.01); *H01L 24/48* (2013.01); *H01L 24/73* (2013.01); *H01L 25/0655* (2013.01); *H02M 1/007* (2021.05); *H02M 3/003* (2021.05); *H02M 7/003* (2013.01); *H01L 2224/32245* (2013.01); *H01L 2224/48245* (2013.01); *H01L 2224/73265* (2013.01); *H01L 2924/1203* (2013.01); *H01L 2924/13055* (2013.01); *H01L 2924/35121* (2013.01)

(58) Field of Classification Search
CPC ............. H01L 23/49894; H01L 21/565; H01L 24/32; H01L 24/48; H01L 24/73; H01L 25/0655; H01L 2224/32245; H01L 2224/48245; H01L 2224/73265; H01L 2924/1203; H01L 2924/13055; H01L 2924/35121; H02M 1/007; H02M 3/003; H02M 7/003
See application file for complete search history.

(56) References Cited

U.S. PATENT DOCUMENTS

| | | | | |
|---|---|---|---|---|
| 2019/0355656 A1* | 11/2019 | Hayashi | ................. | H01L 23/40 |
| 2020/0066546 A1 | 2/2020 | Kawashima | | |

* cited by examiner

SEMICONDUCTOR DEVICE AND POWER CONVERTER

CROSS REFERENCE TO RELATED APPLICATIONS

The present application is a continuation application of International Patent Application No. PCT/JP2021/010172 filed on Mar. 12, 2021, which designated the U.S. and claims the benefit of priority from Japanese Patent Application No. 2020-081437 filed on May 1, 2020. The entire disclosures of all of the above applications are incorporated herein by reference.

TECHNICAL FIELD

The present disclosure relates to a semiconductor device and a power converter.

BACKGROUND

A semiconductor device may have a double-sided heat dissipation structure, and the semiconductor device may include a semiconductor element and a metal plate. The semiconductor device may further include a block that electrically connects a semiconductor element and a metal plate.

SUMMARY

The present disclosure describes a semiconductor device and a power converter, and further describes that each of the semiconductor device and the power converter has a semiconductor element, a first wiring member, a second wiring member and a terminal.

BRIEF DESCRIPTION OF DRAWINGS

Objects, features and advantages of the present disclosure will become more apparent from the following detailed description made with reference to the accompanying drawings. In the drawings:

FIG. 2 is a plan view showing a semiconductor module;

FIG. 3 is a side view of FIG. 2 as viewed in an X1 direction;

FIG. 6 is a cross-sectional view taken along a line VI-VI in FIG. 4;

FIG. 7 is a cross-sectional view taken along a line VII-VII in FIG. 4;

FIG. 8 is a cross-sectional view taken along a line VIII-VIII in FIG. 4;

FIG. 10 is a plan view that illustrates a state in which a semiconductor element and a terminal are arranged;

DETAILED DESCRIPTION

Figure 1:
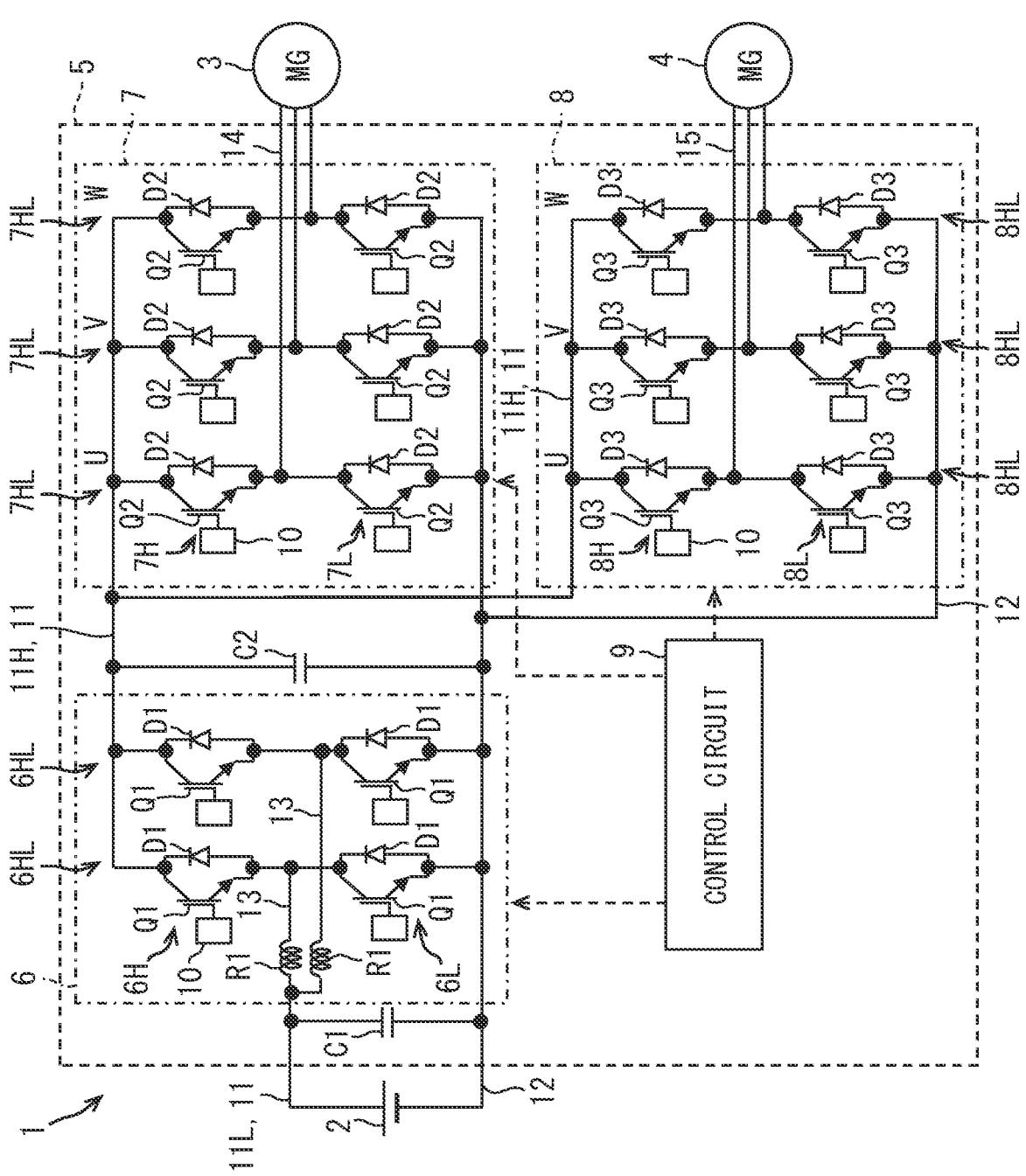
FIG. 1 illustrates a schematic configuration of a drive system of a vehicle to which a power converter is applied, according to a first embodiment.

A large amount of solder may be arranged between a metal plate and a block included in a semiconductor device to absorb variation in the height of the semiconductor device. The metal plate may have a groove for accommodating surplus portion of the solder on a surface of the groove facing the block. The groove may be provided according to the size of the block to overlap the outer peripheral edge of the end face of the block. The semiconductor device may be further enhanced in view of the above description.

According to a first aspect of the present disclosure, a semiconductor device includes a semiconductor element, a first wiring member, a second wiring member, and a terminal. The semiconductor element includes a first main electrode and a second main electrode. The first main electrode is at a first surface of the semiconductor element. The second main electrode is disposed at a second surface of semiconductor element on a side opposite from the first surface in a thickness direction of the semiconductor element. The first wiring member is connected to the first main electrode. The terminal has a first terminal surface connected to the second main electrode and a second terminal surface on a side opposite from the first terminal surface in the thickness direction. The second terminal surface has four sides. Two of the four sides are parallel to a first direction intersecting the thickness direction, and other two sides of the four sides are parallel to a second direction perpendicular to the thickness direction and the first direction. The second wiring member is connected to the second terminal surface of the terminal through solder. The second wiring member has a connection region and a groove at a facing surface of the second wiring member. The facing surface faces the terminal. The connection region is connected to the terminal. The groove surrounds the connection region and accommodates a surplus portion of the solder. In a plan view of the groove in the thickness direction, the groove overlaps one or two of the four sides of the second terminal surface.

According to the above semiconductor device, the groove of the second wiring member is provided to overlap the second side of the second terminal surface of the terminal in the plan view. Therefore, the surplus portion of the solder easily flows into the groove. It is possible to accommodate the surplus portion of the solder. In addition, the groove is provided to overlap one or two of the four sides of the second terminal surface. Thus, the groove having a structure common for the multiple terminals with different sizes can accommodate the surplus portion of solder. As a result, it is possible to accommodate the surplus portion of the solder while reducing the number of different types of components.

According to a second aspect of the present disclosure, a power converter includes a first semiconductor device included in a first power conversion device and a second semiconductor device included in a second power conversion device. Each of the first semiconductor device and the second semiconductor device includes a semiconductor element, a first wiring member, a second wiring member, and a terminal. The semiconductor element includes a first main electrode and a second main electrode. The first main electrode is at a first surface of the semiconductor element. The second main electrode is disposed at a second surface of semiconductor element on a side opposite from the first surface in a thickness direction of the semiconductor element. The first wiring member is connected to the first main electrode. The terminal has a first terminal surface connected to the second main electrode and a second terminal surface on a side opposite from the first terminal surface in the thickness direction. The second terminal surface has four sides. Two of the four sides are parallel to a first direction intersecting the thickness direction, and other two sides of the four sides are parallel to a second direction perpendicular to the thickness direction and the first direction. The second wiring member is connected to the second terminal surface of the terminal through solder. The second wiring member has a connection region and a groove at a facing surface of the second wiring member. The facing surface faces the terminal. The connection region is connected to the terminal. The groove surrounds the connection region and accommodates a surplus portion of the solder. A size of the terminal in each of the first semiconductor device and the second semiconductor device is distinct in a plan view of the first semiconductor device and the second semiconductor device in the thickness direction, and a size of the groove in each of the first semiconductor device and the second semiconductor device is identical. In a plan view of the groove in the thickness direction, the groove in each of the first semiconductor device and the second semiconductor device overlaps one or two of the four sides of the second terminal surface.

According to the above-described power converter, the first semiconductor device and the second semiconductor device respectively have the terminals with different sizes, and the first semiconductor device and the second semiconductor device respectively have the grooves with the identical sizes. The structure of the groove is made to be common for the first semiconductor device and the second semiconductor device. The groove with the common structure overlaps one or two of the four sides of the second terminal surface. Therefore, even though the structure of the groove is made to be common, it is possible to accommodate the surplus portion of the solder. Therefore, it is possible to reduce the number of types of the components in the power converter including a semiconductor included in the multiple power conversion devices.

The following describes multiple embodiments with reference to the drawings. Hereinafter, in the respective embodiments, substantially the same configurations are denoted by identical symbols, and repetitive description will be omitted.

First Embodiment

A power converter according to the present embodiment can be applied to a moving body using a rotating electrical machine as a drive source. The moving body is, for example, an electrically powered vehicle such as an electric vehicle (EV), a hybrid vehicle (HV), or a fuel cell vehicle (FCV), a flying body such as a drone, a ship, a construction machine, or an agricultural machine. Hereinafter, an example of a vehicle (hybrid vehicle) will be described as a moving body. The moving body may also be referred to as a movable body.

Vehicle Drive System

First, a schematic configuration of a vehicle drive system 1 to which a power conversion device 5 is applied will be described with reference to FIG. 1. As shown in FIG. 1, the vehicle drive system 1 includes a direct current power supply 2, motor generators 3, 4, an electric power conversion device 5 that converts electric power between the direct current power supply 2 and the motor generators 3, 4. The direct current power supply 2 may also be written as a DC power supply 2 in the following. In the following, the electric power conversion device 5 is simply referred to as the power conversion device 5.

The DC power supply 2 is a direct-current voltage source including a chargeable/dischargeable secondary battery. The secondary battery is, for example, a lithium ion battery or a nickel hydride battery. The motor generators 3, 4 are three-phase alternating type rotation electric machines.

The motor generator 3 functions as an electric generator alternator) that is driven by an engine (not shown) and generates electricity and functions as an electric motor (starter) that starts the engine. The motor generator 4 functions as a traveling drive source of the vehicle, that is, the electric motor. The motor generator 4 functions also as a generator during regeneration. The vehicle includes, as traveling drive sources, the engine and the motor generator 4. The power conversion device 5 performs electric power conversion between the DC power supply 2 and the motor generator 3.

Circuitry Structure of Power Converter

Next, a circuitry structure of the power conversion device 5 will be described with reference to FIG. 1. As illustrated in FIG. 1, the power conversion device 5 includes, for example, a filter capacitor C1, a smoothing capacitor C2, a converter 6, inverters 7, 8, a control circuit 9, and a drive circuit 10.

A P line 11 is an electric power line on the high potential side, and includes a VL line 11L and the VH line 11H. The VL line 11L is connected to a positive electrode terminal of the DC power supply 2. The converter 6 is disposed between the VL line 11L and the VH line 11H. The potential of the VH line 11H is equal to or higher than the potential of the VL line 11L. An N line 12 is an electric power line on the low potential side that is connected to a negative electrode terminal of the DC power supply 2. The N line 12 may be referred to as a ground line.

The filter capacitor C1 is connected between the VL line 11L and the N line 12. The filter capacitor C1 is connected in parallel to the DC power supply 2. The filter capacitor C1 removes a power supply noise from the DC power supply 2, for example. Since the filter capacitor C1 is placed on the lower voltage side as compared with the smoothing capacitor C2, the filter capacitor C1 is also referred to as a lower voltage capacitor. At least one of the VL line 11L and the N line 12 is provided with a system main relay (SMR) (not shown) between the DC power supply 2 and the filter capacitor C1.

The smoothing capacitor C2 is connected between the VH line 11H and the N line 12. The smoothing capacitor C2 is placed between the converter 6 and the inverters 7 and 8. The converter 6 and the inverters 7 and 8 are connected in parallel. For example, the smoothing capacitor C2 smoothens the direct voltage boosted by the converter 6 and accumulates the electric charge of the direct voltage. A voltage between the ends of the smoothing capacitor C2 is a high direct voltage for driving the motor generators 3, 4. The voltage between both ends of the smoothing capacitor C2 is equal to or higher than the voltage between both ends of the filter capacitor C1. Since the smoothing capacitor C2 is placed on the higher voltage side as compared with the filter capacitor C1, the smoothing capacitor C2 is also referred to as a higher voltage capacitor.

The converter 6 and the inverters 7, 8 included in the power converter respectively include a vertical arm circuit 6HL, a vertical arm circuit 7HL and a vertical arm circuit 8HL. Each of the vertical arm circuits 6HL, 7HL, 8HL is connected between the VH line 11H and the N line 12. The vertical arm circuit 6HL included in the converter 6 has an upper arm 6H at a side closer to the VH line 11H and a lower arm 6L. The upper arm 6H and the lower arm 6L are connected in series. Similarly, the vertical arm circuit 7HL included in the inverter 7 has an upper arm 7H and a lower arm 7L that are connected in series. Similarly, the vertical arm circuit 8HL included in the inverter 8 has an upper arm 8H and a lower arm 8L that are connected in series. Each of the upper arms 6H, 7H, 8H and the lower arms 6L, 7L, 8L may be simply described as an arm.

Each of the arms 6H, 6L includes a switching element Q1 and a freewheeling diode D1 connected to the switching element Q1 in anti-parallel manner. Each of the arms 7H, 7L includes a switching element Q2 and a freewheeling diode D2 connected to the switching element Q2 in anti-parallel manner. Each of the arms 8H, 8L includes a switching element Q3 and a freewheeling diode D3 connected to the switching element Q3 in anti-parallel manner. In the present embodiment, as the switching elements Q1, Q2 and Q3, an n-channel type IGBT is adopted. The switching elements Q1 and Q2 are not limited to the IGBT. For example, a MOS-FET may be adopted. As the diodes D1, D2 and D3, parasitic diodes can also be used.

The converter 6 corresponds to a DC-DC converter. The converter 6 converts the direct voltage into the direct voltage having the different value in accordance with a switching control by the control circuit 9. The converter 6 has a function of boosting the direct voltage supplied from the DC power supply 2. Further, the converter 6 has a drop function of charging the DC power supply 2 with use of the electric charges of the smoothing capacitor C2. The converter 6 includes the vertical arm circuit 6HL and a reactor R1.

With regard to the vertical arm circuit 6HL, a collector of the switching element Q1 is connected to the VH line 11H at a side closer to the upper arm 6H, and an emitter of the switching element Q2 is connected to the N line 12 at a side closer to the lower arm 6L. The emitter of the switching element Q1 at a side closer to the upper arm and the collector of the switching element Q2 are connected to each other. A first end of the reactor R1 is connected to the VL line 11L. A second end of the reactor R1 is connected to a connection point between the upper arm 6H and the lower arm 6L. In the present embodiment, the converter 6 is configured as a multi-phase converter, specifically, a two-phase converter. The converter 6 has the vertical arm circuit 6HL for each of two phases and the reactor R1 provided at each vertical arm circuits 6HL.

The inverters 7, 8 correspond to a DC-AC converter. The inverter 7 is connected to the converter 6 via the smoothing capacitor C2. The inverter 7 converts the direct voltage into a three-phase AC voltage in accordance with the switching control by the control circuit 9, and outputs the three-phase AC voltage to the motor generator 3. Thereby, the motor generator 3 is driven to generate a predetermined torque. In response to the output of the engine, the inverter 7 can convert the three-phase AC voltage generated by the motor generator 3 into the direct voltage in accordance with the switching control by the control circuit 9, and output the direct voltage to the VH line 12H. In such a manner, the inverter 7 performs bidirectional electric power conversion between the converter 6 and the motor generator 3. The inverter 7 has the vertical arm circuit 7HL for each of three phases (U-phase, V-phase, W-phase).

With regard to the vertical arm circuit 7HL, a collector of the switching element Q2 is connected to the VH line 11H at a side closer to the upper arm 7H, and an emitter of the switching element Q2 is connected to the N line 12 at a side closer to the lower arm 7L. The emitter of the switching element Q2 at a side closer to the upper arm and the collector of the switching element Q2 are connected to each other. The connection point of the vertical arm circuit 7HL in each phase is connected to the winding in accordance with the corresponding phase via an output wiring 14 placed for each phase.

Similarly, the inverter 8 is connected to the converter 6 via the smoothing capacitor C2. The inverter 8 converts the direct voltage into a three-phase AC voltage in accordance with the switching control by the control circuit 9, and outputs the three-phase AC voltage to the motor generator 4. Thereby, the motor generator 4 is driven to generate a predetermined torque. At the time of regenerative braking of the vehicle, in response to the rotational force of the vehicle wheels, the inverter 8 can convert the three-phase AC voltage generated by the motor generator 4 into the direct voltage in accordance with the switching control by the control circuit 9, and output the direct voltage to the VH line 11H. In such a manner, the inverter 8 performs bidirectional electric power conversion between the converter 6 and the motor generator 4. The inverter 8 has the vertical arm circuit 7HL for each of three phases (U-phase, V-phase, W-phase).

With regard to the vertical arm circuit 8HL, a collector of the switching element Q3 is connected to the VH line 11H at a side closer to the upper arm 8H, and an emitter of the switching element Q3 is connected to the N line 12 at a side closer to the lower arm 8L. The emitter of the switching element Q3 at a side closer to the upper arm and the collector of the switching element Q3 are connected to each other. The connection point of the vertical arm circuit 8HL in each phase is connected to the winding in accordance with the corresponding phase via an output wiring 15 placed for each phase.

The control circuit 9 generates the drive instruction for operating the switching elements Q1, Q2, Q3 and outputs the drive instruction to a drive circuit 10. The control circuit 9 generates the drive command based on a torque request input from a higher-level ECU (not shown) or signals detected by various sensors. The control circuit outputs, for example, a PWM signal as the drive command. The control circuit 9 includes, for example, a microcomputer. ECU is an abbreviation for Electronic Control Unit. PWM is an abbreviation for Pulse Width Modulation.

Various sensors include, for example, a current sensor, a rotation angle sensor, a voltage sensor, and a temperature sensor. One of the current sensors detects a phase current flowing through each phase winding of the motor generators 3, 4. Another one of the current sensors detects the current through the reactor R1. The rotation angle sensor detects the rotation angle of the rotor of each of the motor generators 3, 4. One of the voltage sensors detects the voltage between both ends of the smoothing capacitor C2, that is, the voltage of the VH line 11H. Another one of voltage sensors detects the voltage across the filter capacitor C1, that is, the voltage on the VL line 11L. The temperature sensor detects a temperature of the reactor R1. The power conversion device 5 has these sensors (not shown).

The drive circuit 10 generates the drive signal based on the drive instruction from the control circuit 9, and outputs the drive instruction to the gate of switching elements Q1, Q2, Q3 of the corresponding arms 6H, 6L, 7H, 7L, 8H, 8L. The drive circuit 10 drives the corresponding switching element Q1, Q2, Q3 to turn on and off by applying a drive voltage. The drive circuit 10 may also be referred to as a driver. In the present embodiment, one drive circuit 10 is provided for one arm. The arrangement of the drive circuit 10 is not only limited to the above description. For example, the drive circuit 10 may also be provided for each of the vertical arm circuits 6HL, 7HL, 8HL.

Semiconductor Module

Next, a schematic configuration of a semiconductor module 16 will be described with reference to FIGS. 2, 3. FIG. 3 is a side view of FIG. 2 as viewed from an X1 direction. FIG. 3 illustrates the semiconductor module 16 and a circuit board 19. In the following, the stacking direction of a semiconductor device 17 and a cooler 18 is referred to as a Z-direction. A direction perpendicular to the Z-direction is referred to the X-direction, and a direction perpendicular to both of the Z-direction and the X-direction is referred to the Y-direction.

Figure 2:
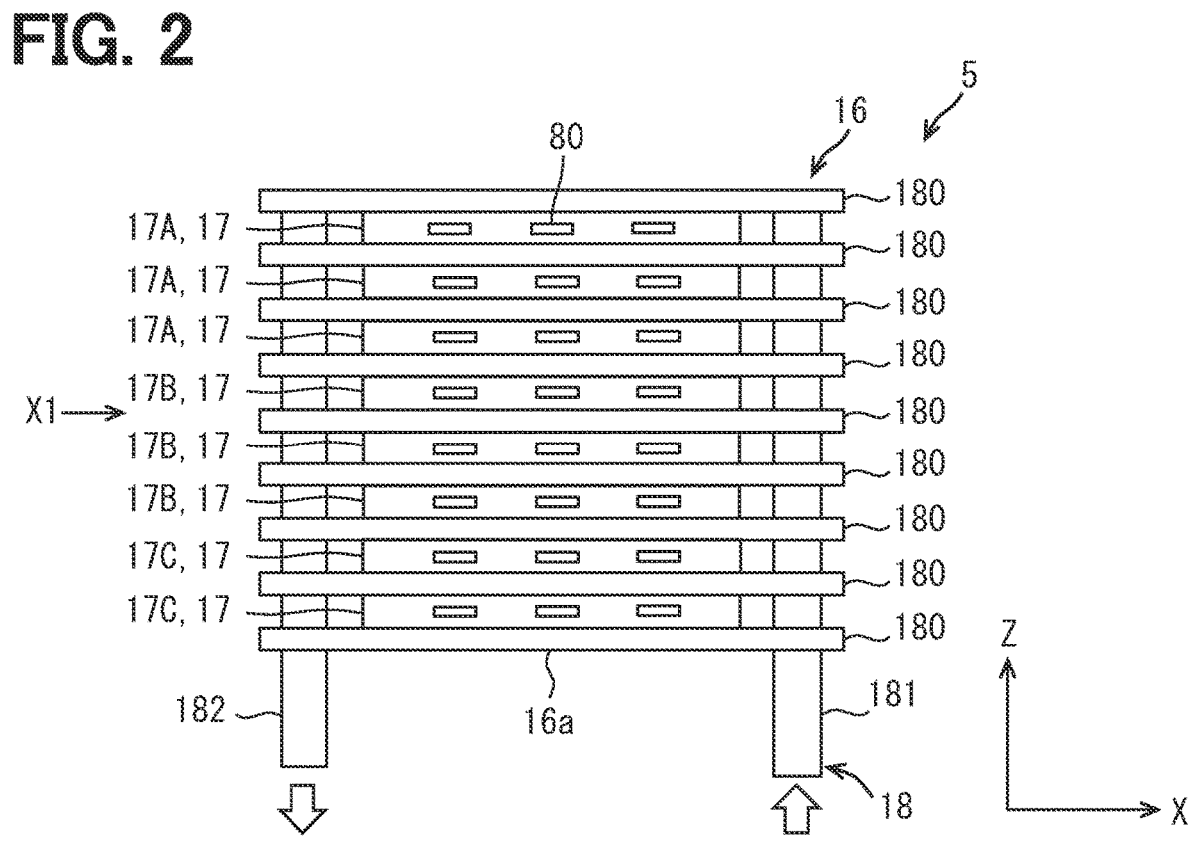
Figure 3:
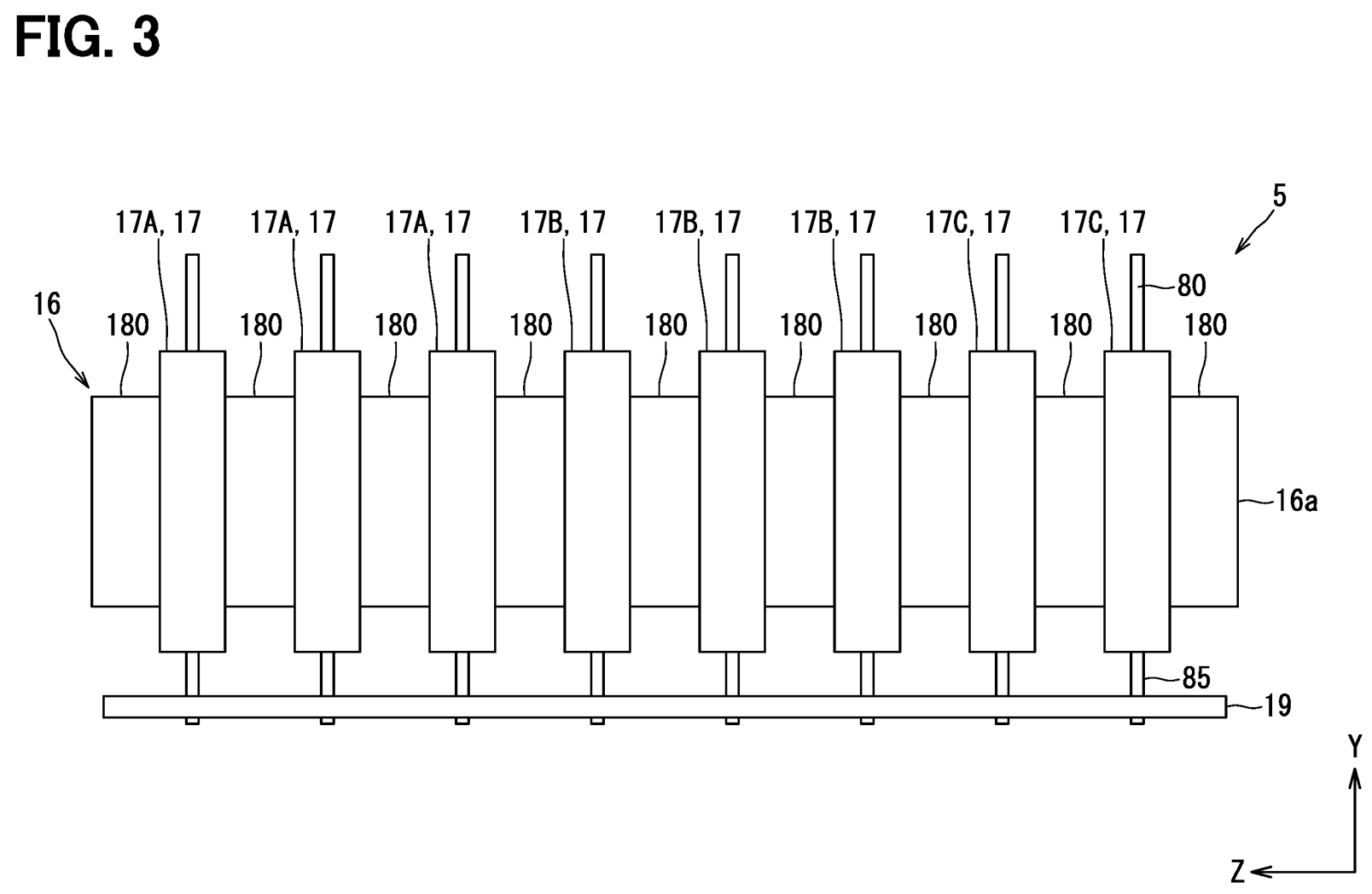

As illustrated in FIGS. 2, 3, the power conversion device 5 includes the semiconductor module 16. The semiconductor module 16 includes the inverters 7, 8 and the vertical arm circuit 6HL in the converter 6. The semiconductor module 16 includes multiple semiconductor devices 17 and a cooler 18 that cools the semiconductor devices 17. The semiconductor module 16 is housed in a housing (not shown) included in the power conversion device 5. The housing also accommodates the filter capacitor C1, the smoothing capacitor C2, and the reactor R1 described above. The housing also accommodates the circuit board 19 including the control circuit 9 and the drive circuit 10.

The semiconductor device 17 includes a semiconductor devices 17A, 17B, 17C. The semiconductor device 17A is included in the inverter 7. The semiconductor device 17B is included in the inverter 8. The semiconductor device 17C is included in the vertical arm circuit 6HL in the converter 6. In the present embodiment, one of the semiconductor devices 17 is included in one of the vertical arm circuits. The semiconductor module 16 includes three semiconductor devices 17A, three semiconductor devices 17B and two semiconductor devices 17C. The three semiconductor devices 17A are respectively included in three vertical arm circuits 7HL for corresponding phases. The three semiconductor devices 17B are respectively included in three vertical circuits 8HL for corresponding phases. The two semiconductor devices 17C are included in two vertical circuits &HL for corresponding phases. The outlines of the semiconductor devices 17A, 17B, 17C are substantially identical to each other.

The cooler 18 is formed of a material having excellent thermal conductivity, for example, an aluminum-based material. The cooler 18 includes a heat exchanger 180, an inlet pipe 181, and a discharge pipe 182. The heat exchanger 180 is accommodated in the housing. The heat exchanger 180 has a flat tubular body as a whole. For example, the heat exchanger 180 is formed by pressing at least one of a pair of plates (thin metal plates) into a bulging shape in the Z-direction. Subsequently, the respectively outer peripheral edges of the one pair of the plates are fixed to each other by caulking or the like, and the entire circumference is joined to each other by brazing or the like. As a result, a flow path through the coolant can flow is formed between a pair of the plates and can be adopted as the heat exchanger 180.

The heat exchanger 180 and the semiconductor device 17 stack alternately in the Z-direction. The semiconductor device 17 and the heat exchanger 180 are arranged in the Z direction. Each of the semiconductor devices 17 is sandwiched between the heat exchanges 180 in the Z-direction. A stacking body 16a including the semiconductor device 17 and the heat exchanger 180 is set as each of both ends of the heat exchanger 180 in the Z-direction.

Each of the inlet pipe 181 and the discharge pipe 182 is arranged over the inside and outside of the housing. Each of the inlet pipe 181 and the discharge pipe may be made of one member, or may be made of multiple members. The inlet pipe 181 and the discharge pipe 182 are connected to each of the heat exchanger 180. When the refrigerant is supplied to the inlet pipe 181 via a pump (not shown), the refrigerant flows in a path in the stacking heat exchanger 180. Therefore, each of the semiconductor devices 17 included in the stacking body 16a is cooled by the refrigerant. The refrigerant flowing through each of the heat exchanger 180 is discharged via the discharge pipe 182.

As the refrigerant, a phase-changing refrigerant such as water or ammonia or a non-phase-changing refrigerant such as ethylene glycol can be used. The semiconductor module 16 may include an insulating member (not shown) interposed between the semiconductor device 17 and the heat exchanger 180. As the insulating member, for example, a ceramic plate, a grease or gel-like thermally conductive member, or combination thereof can be adopted. With the arrangement of the insulating member, for example, the semiconductor device 17 and the heat exchanger 180 can be electrically insulated.

The semiconductor device 17 has a main terminal 80 and a signal terminal 85 as the terminals for external connection. The main terminal 80 and the signal terminal 85 extend in the opposite directions in the Y-direction. The signal terminal 85 is connected to the circuit board 19 arranged at one side of the stacking body 18a in the Y-direction. The circuit board 19 is provided to overlap all the semiconductor devices 17 included in the stacking body in a plan view in the Y-direction. The signal terminals 85 of the respective semiconductor devices 17 are inserted into the circuit board 19 and mounted on the circuit board 19.

Semiconductor Device

Figure 4:
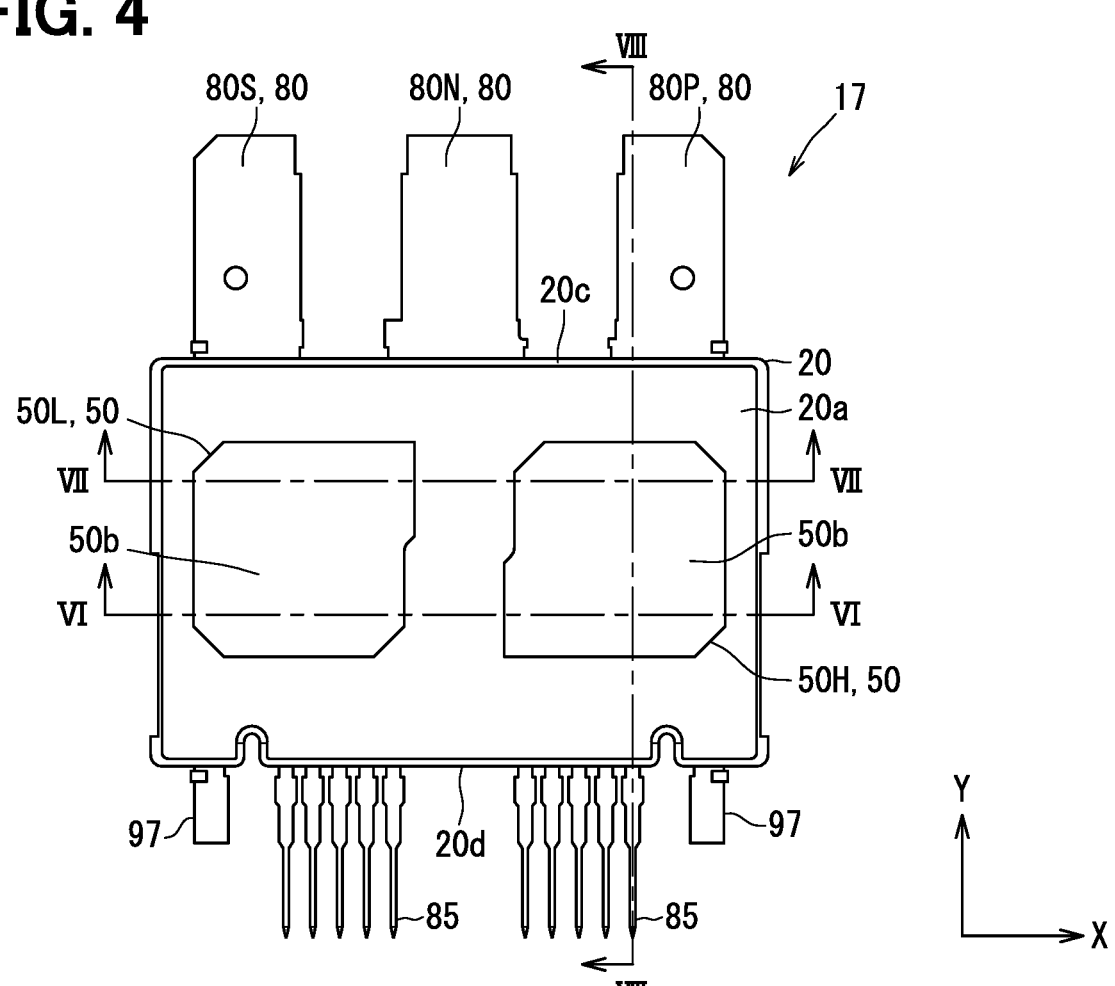
FIG. 4 is a planar view illustrating a semiconductor device according to the first embodiment.
Figure 5:
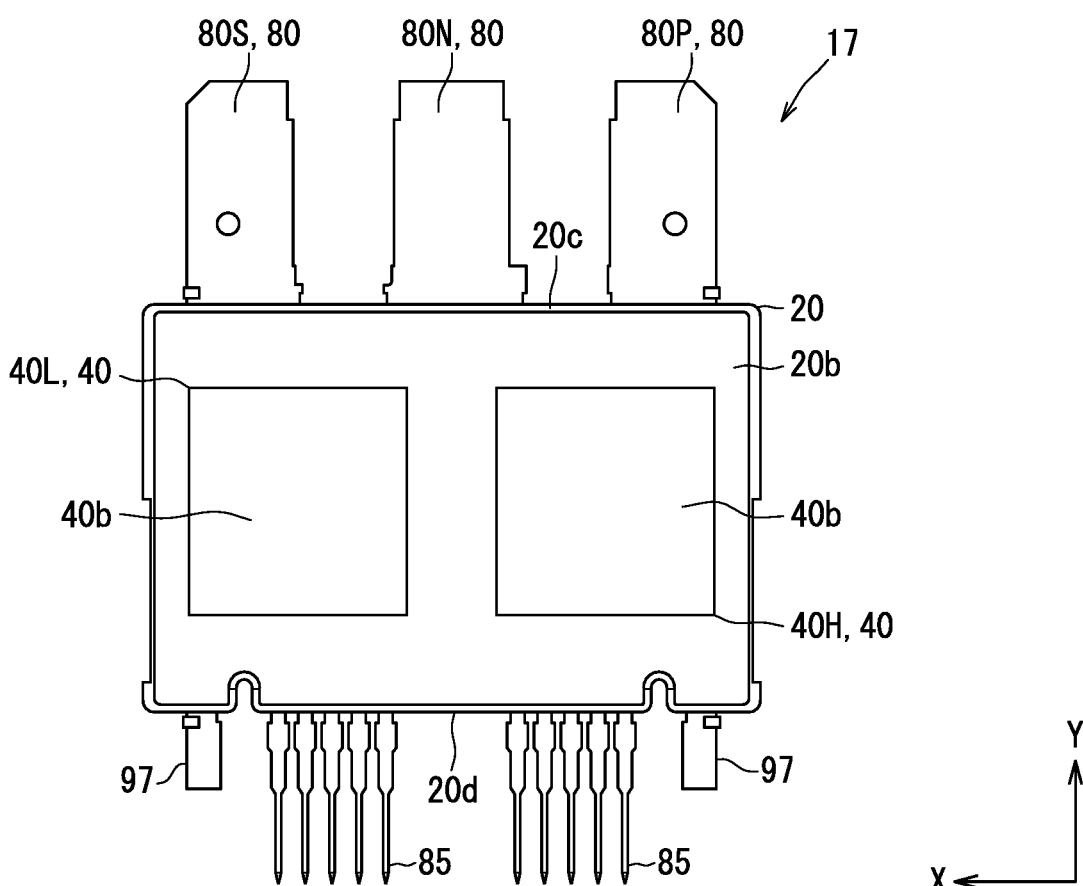
FIG. 5 is a plan view as viewed from FIG. 4.
Figure 6:
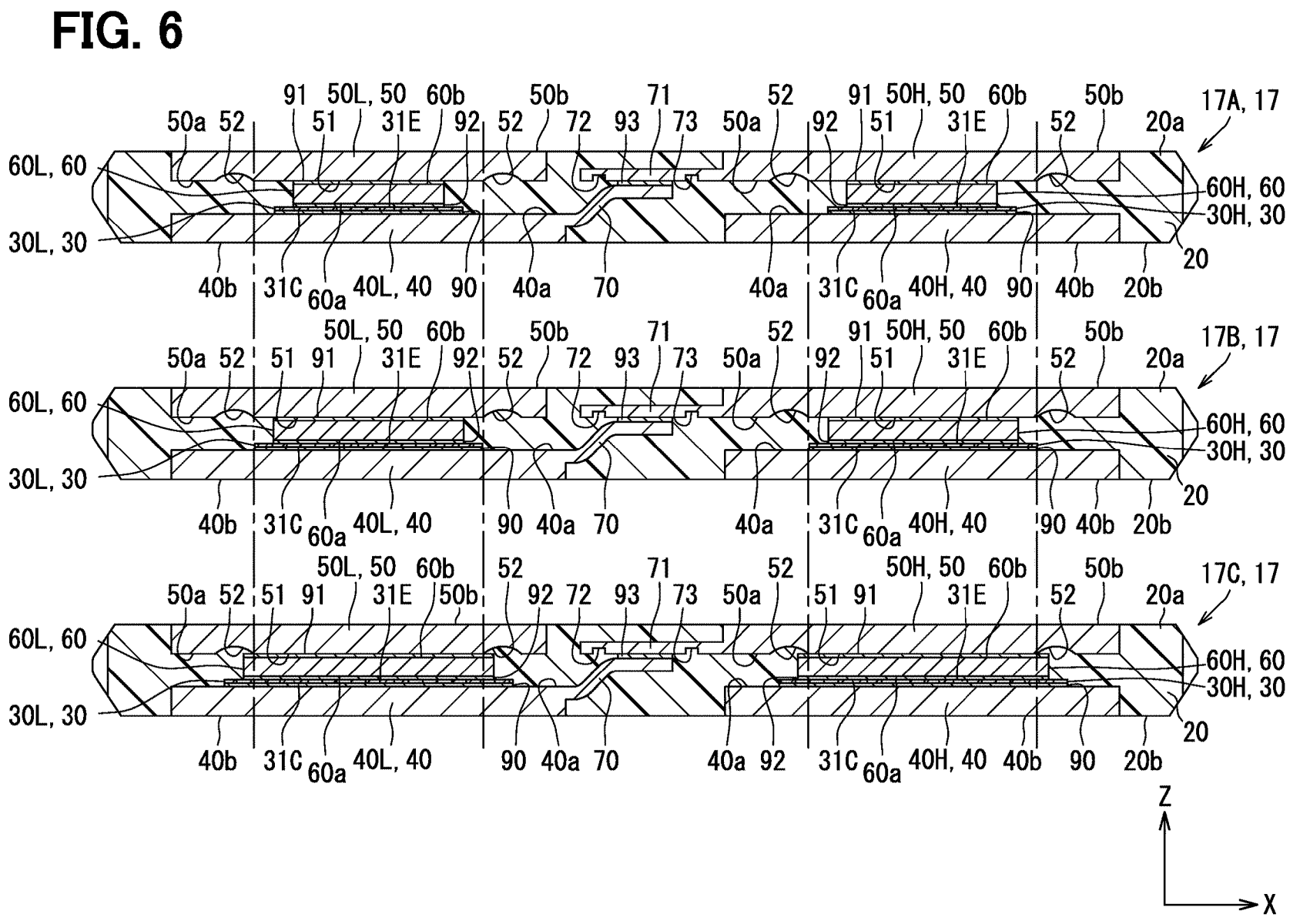
Figure 7:
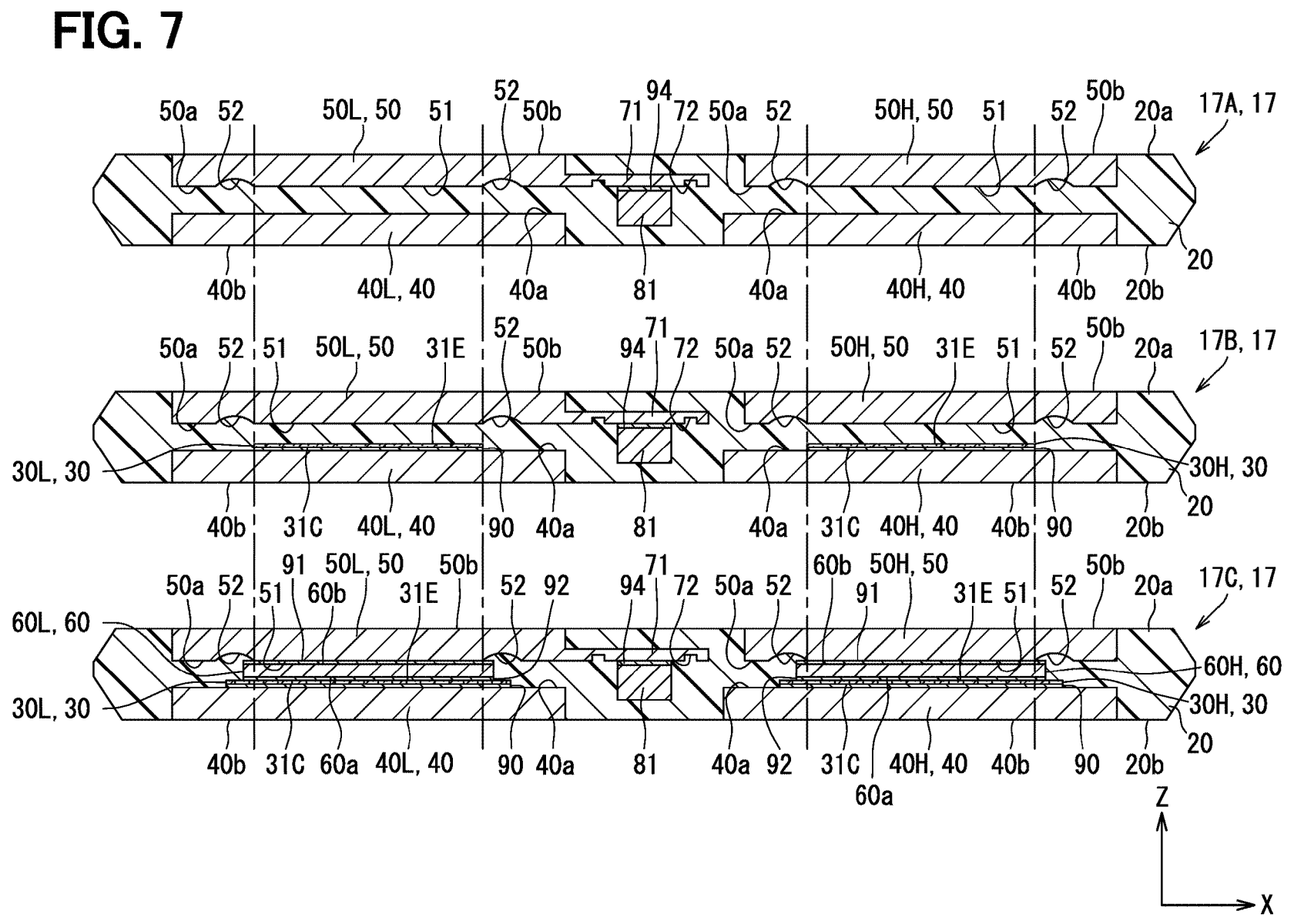
Figure 8:
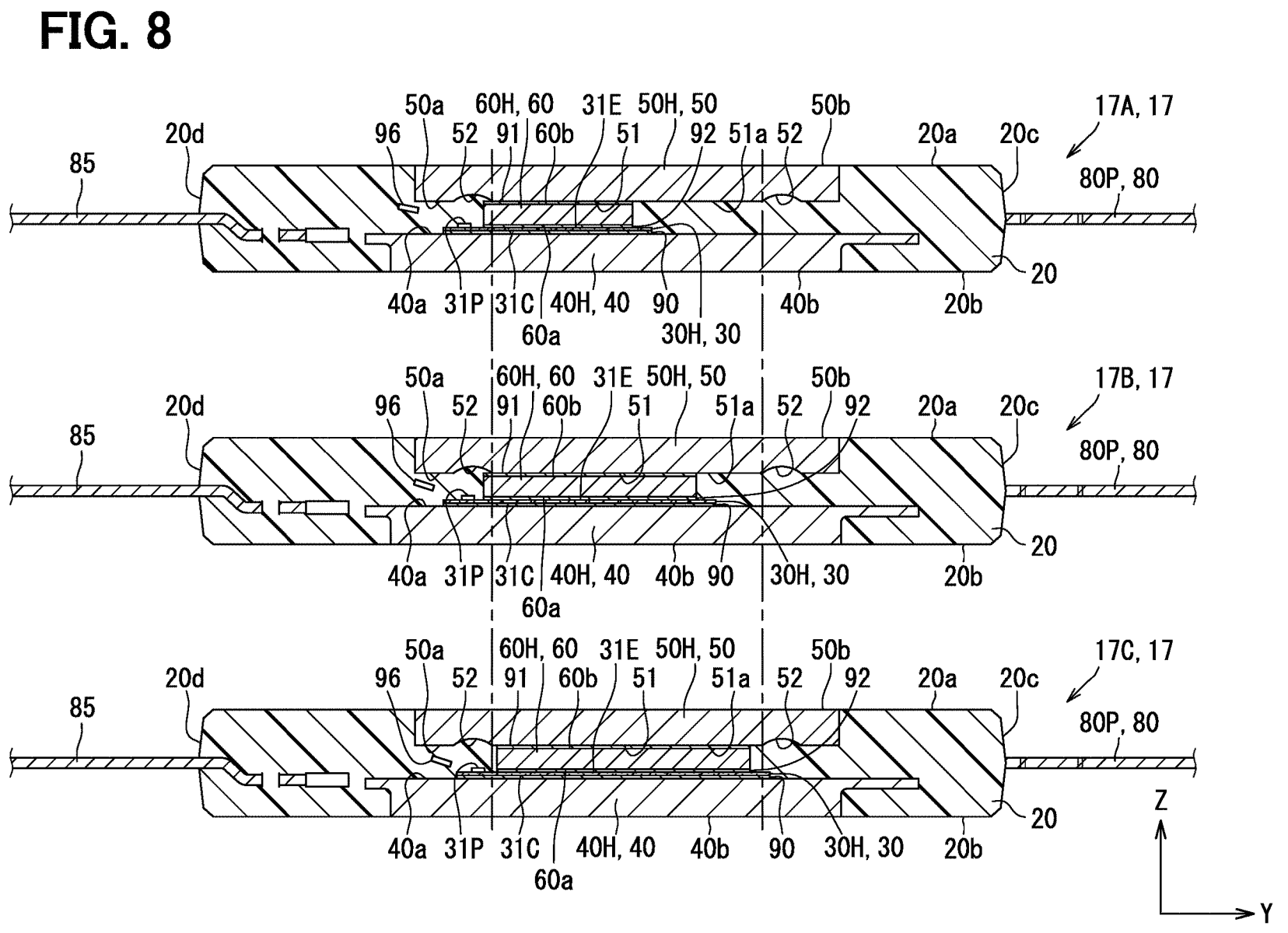
Figure 9:
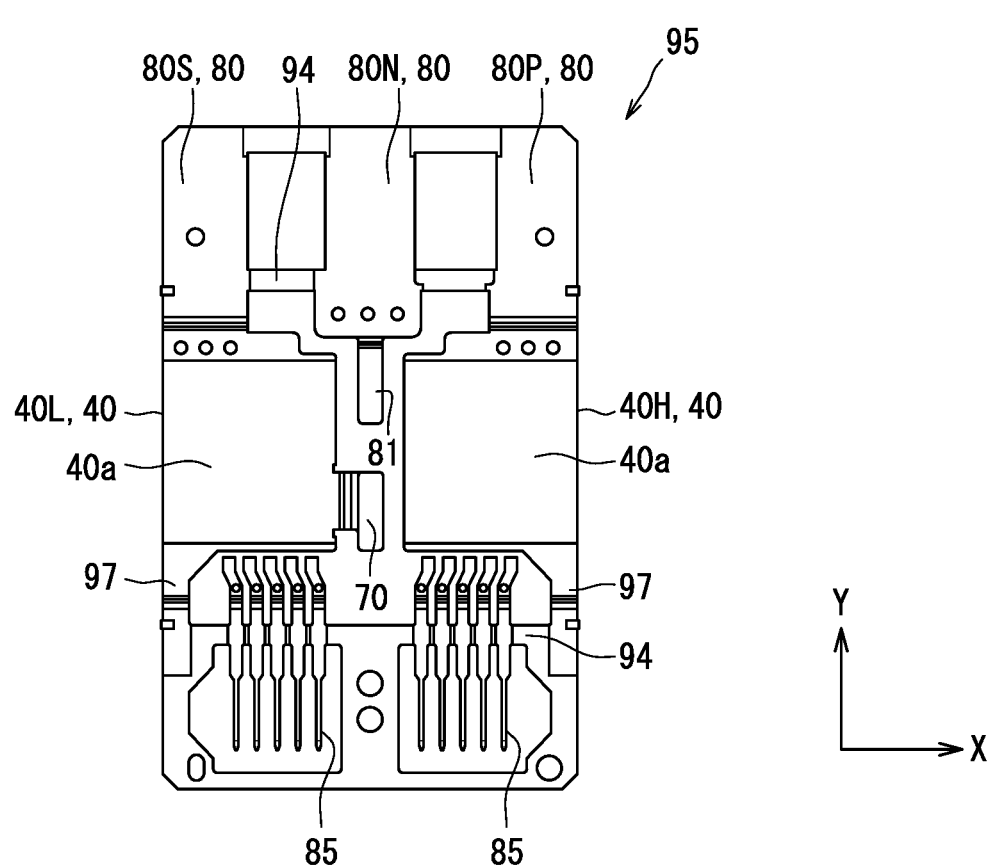
FIG. 9 is a plan view of a lead frame.
Figure 10:
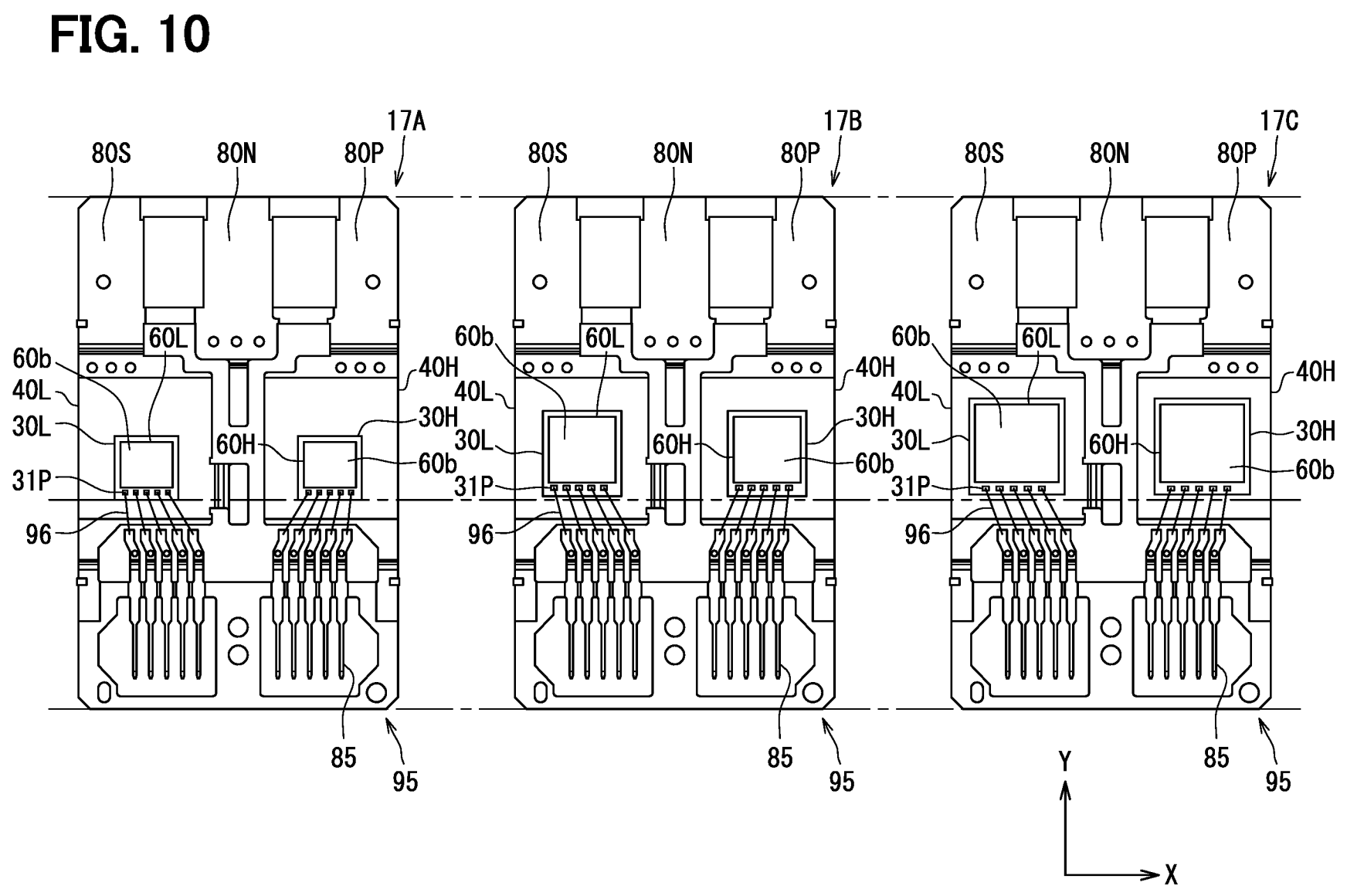
Figure 11:
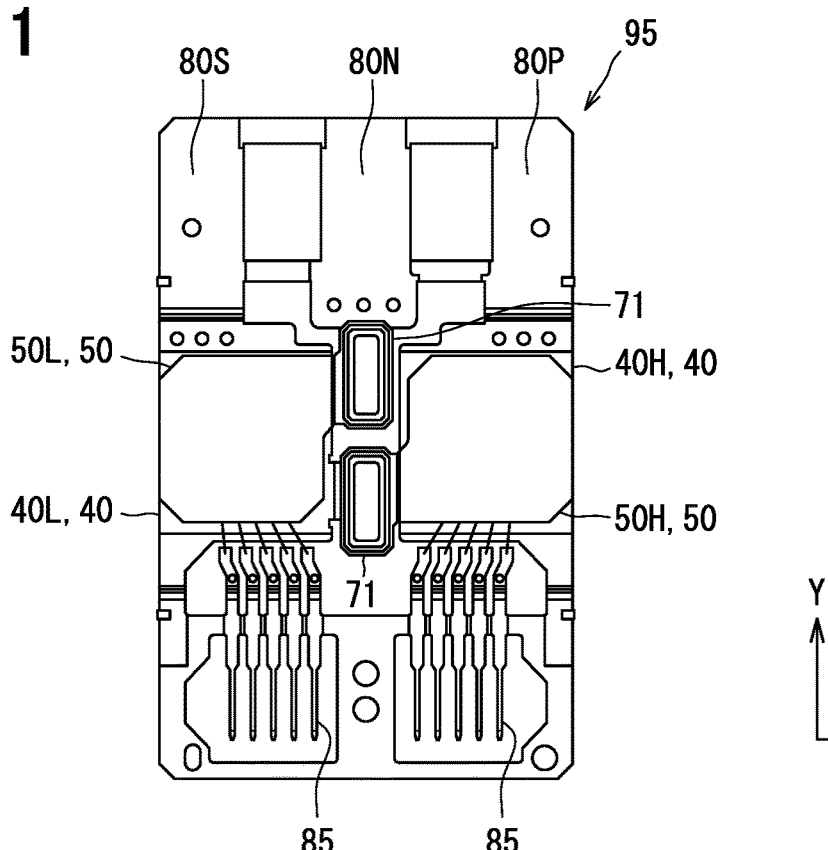
FIG. 11 is a plan view that illustrates a state in which a heat sink is arranged at a side closer to an emitter.

Next, the semiconductor device 17 will be described with reference to FIG. 4 to FIG. 11. FIG. 4 is a plan view of the semiconductor device 17 as viewed from the emitter side. FIG. 5 is a plan view of the semiconductor device 17 as viewed from the collector side. FIG. 6 is a cross-sectional view taken along a VII-VII line in FIG. 4. FIG. 7 is a cross-sectional view taken along a VII-VII line in FIG. 4. FIG. 8 is a cross-sectional view taken along a VIII-VIII in FIG. 4. FIG. 9 is a plan view of a lead frame 95. FIG. 10 is a plan view that illustrates a state in which a semiconductor element 30 and a terminal 60 are arranged on the lead frame 95. FIG. 11 is a plan view that illustrates a state in which a heat sink is arranged at a side closer to the emitter side on the terminal 60. FIGS. 9 to 11 show the state before the cut of the lead frame 95 for convenience.

In the following, for some of the elements included in the semiconductor device 17, "H" indicating the upper arms 6H, 7H, 8H side is added to the end of the reference numeral, and "L" indicating the lower arms 6L, 7L, 8L side is added to the reference numeral. For other elements, common reference numerals are given in the upper arms 6H, 7H, 8H and the lower arms 6L, 7L, 8L. Unless otherwise specified, a shape viewed in a plane from the Z-direction, that is, a shape along an XY plane defined by the X-direction and Y-direction is referred to as a planar shape. A plan view in the Z-direction is simply referred to as a plan view.

The outlines of the semiconductor devices 17A, 17B, 17C are substantially identical to each other. The semiconductor devices 17a, 17B, 17C have the common structures except the size of the semiconductor element 30 and the size of the terminal 60. Therefore, FIGS. 4, 5, 9, and 11 show structures common to the semiconductor devices 17A, 17B, and 17C.

As shown in FIGS. 4 to 11, the semiconductor device 17 includes a sealing resin body 20, the semiconductor element 30, heat sinks 40 and 50, the terminal 60, a joint 70, the main terminal 80, and a signal terminal 85. The semiconductor device 17 shown in FIGS. 2 to 4 configures the vertical arm circuit for one phase.

The sealing resin body 20 seals a part of elements included in the semiconductor device 17. The other elements are exposed to the outside of the sealing resin body 20. The sealing resin body 20 is made of material such as an epoxy resin. The sealing resin body 20 is molded by, for example, a transfer molding method. As shown in FIGS. 2, 3, the sealing resin body 20 has a substantially rectangular shape in a plane. The sealing resin body 20 has a front surface 20a and a rear surface 20b opposite to the first surface 20a in the Z-direction. The front surface 20a and the rear surface 20b are, for example, flat surfaces.

The semiconductor element 30 includes a vertical element formed on a semiconductor substrate made of material such as silicon and a wide bandgap semiconductor having a wider bandgap than silicon. Examples of wide bandgap semiconductors include silicon carbide (SiC), gallium nitride (GaN), gallium oxide (Ga$_2$O$_3$) and diamond. The vertical element is made such that the main current flows in the plate's thickness direction of the semiconductor element 30 (semiconductor substrate), that is, in the Z-direction.

The semiconductor element 30 of the semiconductor device 17A is provided by forming the switching element Q1 and the diode D1 as the vertical elements. Similarly, the semiconductor element 30 of the semiconductor device 17B is provided by forming the switching element Q2 and the diode D2 on the semiconductor substrate. Similarly, the semiconductor element 30 of the semiconductor device 17C is provided by forming the switching element Q3 and the diode D3. The present embodiment adopts an insulated gate bipolar transistor (IGBT) as the switching elements Q1, Q2, Q3, and the vertical element is a reverse conducting (RC)-IGBT.

The semiconductor element 30 includes a gate electrode (not shown). The gate electrode has, for example, a trench structure. Further, the semiconductor element 30 has main electrodes on both sides thereof in the thickness direction, that is, in the Z-direction. Specifically, as the main electrode, the collector electrode 31C is provided on one surface side, and the emitter electrode 31E is provided on the back surface side, which is the opposite surface to the one surface side. The collector electrode 31C also functions as a cathode electrode of the diode. The emitter electrode 31E also functions as an anode electrode of the diode. The collector electrode 31C corresponds to a first main electrode, and the emitter electrode 31E corresponds to a second main electrode.

The semiconductor element 30 has a substantially rectangular shape in a plane. The semiconductor element 30 includes a pad at a position different from the emitter electrode 31E at the rear surface. The emitter electrode 31E and the pad 31P are exposed from a protective film (not shown). The collector electrode 31C is formed on almost the entire surface of the semiconductor element 30. The emitter electrode 31E is formed on a part of the rear surface of the semiconductor element 30. In a plan view, the collector electrode 31C has an area larger than the emitter electrode 31E. The emitter electrode 31E has a substantially rectangular shape in a plane.

The pad 31P is an electrode for signals. The pad 31P is electrically isolated from the emitter electrode 31E. The pad 31P are formed at an end portion on the side opposite to the formation region of the emitter electrode 31E in the Y-direction. The pad 31P is provided side by side with the emitter electrode 31E in the Y-direction. The pad 31P includes at least a pad for a gate electrode. In the present embodiment, the semiconductor element 30 has the five pads 31P. Specifically, the five pads 31P are provided for a gate electrode, a Kelvin emitter for detecting a potential of the emitter electrode 31E, a current sense, an anode potential of a temperature sensor (temperature-sensitive diode) for detecting a temperature of the semiconductor element 30, and a cathode potential. The five pads 31P are collectively formed on one end side in the Y direction in the semiconductor element 30 having a substantially rectangular planar shape, and are formed side by side in the X-direction.

The semiconductor device 17 includes two semiconductor elements 30. That is, the semiconductor device 17A includes a semiconductor element 30H included in the upper arm 6H and a semiconductor element 30L included in the lower arm 6L. With regard to the semiconductor device 17A, both of the semiconductor elements 30H, 30L have the identical structures. The semiconductor elements 30H and 30L are arranged in the X-direction. The semiconductor elements 30H, 30L are arranged at substantially the same position in the Z-direction.

The semiconductor device 17B includes a semiconductor element 30H included in the upper arm 7H and a semiconductor element 30L included in the lower arm 7L. With regard to the semiconductor device 17B, both of the semiconductor elements 30H, 30L have the identical structures. The semiconductor elements 30H and 30L are arranged in the X-direction. The semiconductor elements 30H, 30L are arranged at substantially the same position in the Z-direction. That is, the semiconductor device 17C includes a semiconductor element 30H included in the upper arm 8H and a semiconductor element 30L included in the lower arm 8L. With regard to the semiconductor device 17C, both of the semiconductor elements 30H, 30L have the identical structures. The semiconductor elements 30H and 30L are arranged in the X-direction. The semiconductor elements 30H, 30L are arranged at substantially the same position in the Z-direction.

As shown in FIGS. 6, 8, 10, semiconductor devices 17A, 17B, and 17C have semiconductor elements 30 with different sizes. The size described above refers to the size (area) of the planar shape. The semiconductor elements 30H and 30L of semiconductor device 17C included in the converter 6 are larger than semiconductor elements 30H and 30L of semiconductor devices 17A and 17B included in the inverters 7 and 8, respectively. The semiconductor elements 30H and 30L of semiconductor device 17A included in the inverter 7 are larger than semiconductor elements 30H and 30L of the semiconductor devices 17B and 17C included in the inverter 7 and the converter 6, respectively. The sizes of the respective semiconductor elements 30 satisfy the relationship of the semiconductor device 17A<the semiconductor device 17B<the semiconductor device 17C. The sizes of the respective emitter electrodes 31E satisfy the relationship of the semiconductor device 17A<the semiconductor device 17B<the semiconductor device 17C.

The thickness of the semiconductor element 30 is set according to required characteristics such as a breakdown voltage. The semiconductor devices 17A, 17B, 17C may have the substantially identical thickness, or may have different thickness.

The heat sink 40 are arranged at a side of the semiconductor element 30 near the collector electrode 31C in the Z-direction. The heat sink 40 is electrically connected to the collector electrode 31C through solder 90. The heat sink 40 corresponds to a first wiring member. The heat sink 40 includes a facing surface 40a as a surface at the semiconductor element 30, and a rear surface 40b at the rear side of the facing surface 40a. The solder 90 is interposed between the facing surface 40a of the heat sink 40 and the collector electrode 31C of the semiconductor element 30, and a solder joint is formed.

The heat sink 40 radiates heat of the semiconductor element 30 towards outside. As the heat sink 40 (the first wiring member), for example, a metal plate made of copper or a copper alloy, a DBC (Direct Bonded Copper) substrate, or the like can be adopted. The heat sink 40 may include a plating film such as nickel or silver at the surface. The heat sink 40 according to the present embodiment is a metal plate made of copper. The heat sink 40 is configured as a part of the lead frame 95. The heat sink 40 is the thick part in the multi-gauge strip lead frame 95. The semiconductor device 17 includes two heat sinks 40. The semiconductor device 17 includes a heat sink 40H included in the upper arm and a heat sink 40L included in the lower arm.

As illustrated in FIG. 9, the heat sinks 40H and 40L have a substantially rectangular shape in a plan view. The heat sinks 40H and 40L are arranged in the X-direction. The heat sinks 40H, 40L have substantially identical thickness, and are disposed at substantially identical positions in the Z-direction. A joint made of the solder 90 is formed between the facing surface 40a of the heat sink 40H and the collector electrode 31C of the semiconductor element 30H and between the facing surface 40a of the heat sink 40L and the collector electrode 31C of the semiconductor element 30L.

The heat sinks 40H, 40L accommodate the corresponding semiconductor elements 30 in the plan view in the Z-direction. The rear surface 40b of the heat sinks 40H, 40L is exposed from the sealing resin body 20. The rear surface 40b may also be referred to as a heat radiating surface or an exposing surface. The rear surface 40b is substantially made flush with a rear surface 20b of the sealing resin body 20.

The respective rear surfaces 40b of the heat sinks 40H, 40L are aligned in the X-direction.

The heat sink 50 and the terminal 60 are wiring members arranged at a side closer to the rear surface of the semiconductor element 30 in the Z-direction, and are electrically connected to the emitter electrode 31E. The heat sink 50 corresponds to a second wiring member. The heat sink 50 is connected to the emitter electrode 31E via the terminal 60. Solder 91 is interposed between the heat sink 50 and the terminal 60, and solder 92 is interposed between the terminal 60 and the semiconductor element 30.

The heat sink 50 radiates heat of the semiconductor element 30 towards outside. As the heat sink 50 (the second wiring member), for example, a metal plate made of copper or a copper alloy, a DBC (Direct Bonded Copper) substrate, or the like can be adopted. The heat sink 50 may include a plating film such as nickel or silver at the surface. The heat sink 50 according to the present embodiment is a metal plate made of copper. The heat sink 50 includes a facing surface 50a as a surface at the semiconductor element 30, and a rear surface 50b at the rear side of the facing surface 50a. The semiconductor device 17 includes two heat sinks 50. The semiconductor device 17 includes a heat sink 50H included in the upper arm and a heat sink 50L included in the lower arm.

As illustrated in FIG. 11, the heat sinks 50H and 50L have a substantially rectangular shape in a plan view. The heat sinks 50H and 50L are arranged in the X-direction. The heat sinks 50H, 50L have substantially identical thickness, and are disposed at substantially identical positions in the Z-direction. The heat sinks 50H, 50L accommodate the corresponding semiconductor elements 30 in the plan view in the Z-direction. The heat sinks 50H, 50L have a connection region 51 and a groove 52 at the facing surface 50a facing the terminal 60.

The connection region 51 is a region of the facing surface 50a surrounded by the groove 52. The connection region 51 is a region with a predetermined size (area) determined for electrical connection with the terminal 60. The groove 52 defines the connection region 51 inside. The groove 52 accommodates excess solder 91. The groove 52 is formed in, for example, an annular shape. The excess solder may also be referred to as a surplus portion of the solder.

The rear surface 50b of the heat sinks 50H, 50L is exposed from the sealing resin body 20. The rear surface 50b may also be referred to as a heat radiating surface or an exposing surface. The rear surface 50b is substantially made flush with a surface 20a of the sealing resin body 20. The respective rear surfaces 50b of the heat sinks 50H, 50L are aligned in the X-direction.

The terminal 60 is interposed between the semiconductor element 30 and the heat sink 50 in the Z-direction. The terminal 60 is located in the midway of electrical and thermal conduction paths between the semiconductor element 30 (the emitter electrode 31E) and the heat sink 50. The terminal 60 is a columnar body formed by adopting a metal material such as copper or copper alloy. The terminal 60 may include a plating film at the surface. The terminal 60 may be referred to as a metal block body or a relay member. The terminal 60 includes a terminal surface 60a at a side closer to the semiconductor element 30 and a terminal surface 60b at a side closer to the heat sink 50. The terminal surface 60a corresponds to a first terminal surface, and the terminal surface 60b corresponds to a second terminal surface.

The semiconductor device 17 includes two terminals 60. The semiconductor device 17 includes the terminal 60H included in the upper arm and the terminal 60L included in the lower arm. A joint made of the solder 92 is formed between the terminal surface 60*a* of the terminal 60H and the emitter electrode 31E of the semiconductor element 30H and between the terminal surface 60*a* of the terminal 60L and the emitter electrode 31E of the semiconductor element 30L. A joint made of the solder 91 is formed between the terminal surface 60*b* of the terminal 60H and the heat sink 50H and between the terminal surface 60*b* of the terminal 60L and the facing surface 50*a* of the heat sink 50L.

The terminals 60H, 60L according to the present embodiment are substantially rectangular columnar bodies having substantially the same size as the emitter electrode 31E in the plan view. As illustrated in FIGS. 6, 8, 10, the sizes of the respective terminals 60 satisfy the relationship of the semiconductor device 17A<the semiconductor device 17B<the semiconductor device 17C. The positional relation between the terminal 60 and the groove 52 of the heat sink 50 is described in the following. The thickness (length in the Z direction) of the terminal 60 is substantially the same in the semiconductor devices 17A, 17B, and 17C.

The joints 70, 71 connect the elements included in the vertical arm circuit. The joint connects the elements included in the semiconductor device 17. As shown in FIGS. 6, 9, the joint 70 continues to the heat sink 40L. The thickness of the joint 70 is thinner than the thickness of the heat sink 40L. The joint 70 is connected to a surface (side surface) facing the heat sink 40H while being substantially flush with the facing surface 40*a* of the heat sink 40L. The joint 70 has two bent portions, and has a substantially crank-shape in the ZX plane. The joint 70 is covered by the sealing resin body 20. The joint 70 and the heat sink 40L may be provided by an integral member, so that the joint 70 connects to the heat sink 40L. Alternatively, the joint 70 and the heat sink 40L may be provided by separate members, and be connected to each other so that the joint 70 connects to the heat sink 40L. The joint 70 according to the present embodiment is provided integrally with the heat sink 40L as a part of the lead frame 95.

As shown in FIGS. 6, 7, 11, the joint 70 continues to the heat sink 50. The joint 71 continues to each of the heat sinks 50H, 50L. The thickness of the joint 71 is thinner than the thickness of the corresponding heat sink 50. The joint 71 is covered by the sealing resin body 20. The joint 71 and the heat sink 50 may be provided by an integral member, so that the joint 70 connects to the heat sink 50. Alternatively, the joint 71 and the heat sink 50 may be provided by separate members, and be connected to each other so that the joint 71 connects to the heat sink 50. The joint 71 according to the present embodiment is provided integrally with the corresponding heat sinks 50L, 50L. The joint 71 extends in the X-direction from the side faces mutually facing each other at the heat sinks 50H, 50L.

In the embodiment, the heat sink 50H having the joint 71 and the heat sink 50L having the joint 71 are common members. The arrangement of the heat sink 50H having the joint 71 and the heat sink 50L having the joint 71 is two-fold symmetrical about the Z-axis as the rotation axis. Solder 93 is interposed between the facing surface of the joint 70 continuing to the heat sink 40L and the facing surface of the joint 71 continuing to the heat sink 50H, and soldered joint is formed. The joint surface of the joint 71 has the groove 72 to surround the soldered joint. The groove 72 is formed in, for example, an annular shape. The groove 72 is formed by, for example, press working.

The main terminal 80 and the signal terminal 85 are external connection terminals. The main terminal 80 is a terminal electrically connected to the main electrode of the semiconductor element 30. The main terminal 80 has a positive terminal 80P, a negative terminal 80N, and an output terminal 80S. The positive terminal 80P may also be referred to as a positive electrode terminal, and the negative terminal 80N may also be referred to as a negative electrode terminal. The positive terminal 80P and the negative terminal 80N are power supply terminals. The positive terminal 80P is electrically connected to the positive terminal of the smoothing capacitor C2. The negative terminal 80N is electrically connected to the negative terminal of the smoothing capacitor C2. The positive terminal 80P may also be referred to as a P terminal or a high-potential power supply terminal. The negative terminal 80N may also be referred to as an N terminal or a low-potential power supply terminal.

The positive terminal 80P is connected to an end of the heat sink 40H in the Y-direction. The thickness of the positive terminal 80P is thinner than the thickness of the heat sink 40H. The positive terminal 80P is connected to the heat sink 40H to be substantially flush with the facing surface 40*a*. The positive terminal 80P and the heat sink 40H may be provided by an integral member, so that the positive terminal 80P connects to the heat sink 40H. Alternatively, the positive terminal 80P and the heat sink 40H may be provided by separate members, and be connected to each other so that the positive terminal 80P connects to the heat sink 40H. The positive terminal 80P in the present embodiment is integrally provided with the heat sink 40H as a portion of the lead frame 95. The positive terminal 80P extends in the Y direction from the heat sink 40H and protrudes outward from a side surface 20*c* of the sealing resin body 20. The positive terminal 80P includes a bent portion in the middle of a portion of the positive terminal 80P covered by the sealing resin body 20, and protrudes from the vicinity of the center of the side surface 20*c* in the Z-direction.

As shown in FIGS. 6, 9, the negative terminal 80N is connected to the joint 71 continued to the heat sink 50L. Solder 94 is interposed between the facing surface of the negative terminal 80N and the facing surface of the joint 71. As similar to the positive terminal 80P, the negative terminal 80N extends in the Y-direction and protrudes outward from a side surface 20*c* of the sealing resin body 20. The negative terminal 80N includes a connector 81 near one end in the Y-direction that is connected to the joint 71. A portion of the negative terminal 80N including the connector 81 is covered by the sealing resin body 20, and a remaining portion protrudes from the sealing resin body 20. The connector 81 is thicker than the portion protruding from the sealing resin body 20. The plate thickness of the connector is substantially identical to the thickness of, for example, the heat sink 40. The negative terminal 80N includes a bent portion as similar to the main terminal, and protrudes from the vicinity of the center of the side surface 20*c* in the Z-direction. The negative terminal 80N is configured as a part of the lead frame 95.

The output terminal 80S is connected to the connection node between the upper arm and the lower arm. The output terminal 80S of the semiconductor device 17A is electrically connected to the winding (stator coil) of the corresponding phase of the motor generator 3. The output terminal 80S of the semiconductor device 17B is electrically connected to the winding (stator coil) of the corresponding phase of the motor generator 4. The output terminal 80S of the semiconductor device 17C is electrically connected to the reactor R1. The output terminal 80S may also be referred to as an O terminal. Output terminals 80S of semiconductor devices 17A and 17B included in the inverters 7 and 8 may also be referred to as AC terminals.

The positive terminal 80P is connected to an end of the heat sink 40L in the Y-direction. The thickness of the output terminal 80S is thinner than the thickness of the heat sink 40L. The output terminal 80S is continued to the heat sink 40L to be substantially flush with the facing surface 40a. The output terminal 80S and the heat sink 40L may be provided by an integral member, so that the output terminal 80S connects to the heat sink 40L. Alternatively, the output terminal 80S and the heat sink 40L may be provided by separate members, and be connected to each other so that the output terminal 80S connects to the heat sink 40L. The output terminal 80S according to the present embodiment is provided integrally with the heat sink 40L as a part of the lead frame 95.

The output terminal 80S extends in the Y-direction from the heat sink 40L and protrudes outward from a side surface 20c of the sealing resin body 20, as similar to the positive terminal 80P. The negative terminal 80N includes a bent portion as similar to the positive terminal 80P, and protrudes from the vicinity of the center of the side surface 20c in the Z-direction. The positive terminal 80P, the negative terminal 80N and the output terminal 80S are spaced apart and displaced in order in the X-direction.

The signal terminal 85 is electrically connected to the pad 31P of the corresponding semiconductor element 30. In the present embodiment, the multiple signal terminals are connected via a bonding wire 96. The signal terminal 85 is extended in the Y-direction and protrude to the outside from a side surface 20d of the sealing resin body 20. The side surface 20d is a surface opposite to the side surface 20c in the Y-direction. In the present embodiment, five signal terminals 85 are provided for one semiconductor element 30.

In the signal terminal 85, the inner lead portion disposed inside the sealing resin body 20 has a crank shape as shown in FIGS. 9, 10. In the signal terminal 85, the respective positions of the connecting portion of the bonding wire 96 and the sealed end portion on the side surface 20d are deviated in the X-direction. The connecting portion of the bonding wire 96 is closer to the corresponding semiconductor element 30 (pad 31P) in the X-direction than the sealing end portion on the side surface 20d. By adopting the crank shape in this way, the length of the bonding wire 96 can be shortened, and the wire flow during molding of the sealing resin body 20 can be suppressed.

The reference numeral of 97 is a suspension lead. The heat sink 40 (40H, 40L), the joint 70, the main terminal 80, the signal terminal 85 are formed at the lead frame 95 that is a common member. This lead frame 95 is a multi-gauge strip having a partially different thickness. The signal terminal 85 is connected to the suspension leads 75 via a tie bar 98 in a state before the tie bar cut process. The tie bar 98 is removed or cut as an unnecessary portion of the lead frame 95 after molding the sealing resin body 20.

In the semiconductor device 17, the semiconductor elements 30 included in the vertical arm circuit for one phase are sealed by the sealing resin body 20. The sealing resin body 20 integrally seals the semiconductor elements 30, a part of the heat sink 40, a part of the heat sink 50, a part of the terminal 60, the joints 70, 71, the main terminal 80 and the signal terminal 85.

In the Z-direction, the semiconductor element 30 is arranged between the heat sinks 40 and 50. Thereby, the heat of the semiconductor element 30 can be dissipated to both sides in the Z-direction. The semiconductor device 17 has the double-sided heat dissipation structure. The rear surface 40b of the heat sink 40 is substantially flush with the rear surface 20b of the sealing resin body 20. The rear surface 50b of the heat sink 50 is substantially flush with the front surface 20a of the sealing resin body 20. Since the rear surfaces 40b, 50b are exposed surfaces, it is possible to enhance the heat dissipation.

As described above, the semiconductor elements 30 (30H, 30L) and the terminals 60 (60H, 60L) have different sizes in the semiconductor devices 17A, 17B, 17C. Other elements, specifically, the elements of the lead frame 95 including the heat sink 40, the main terminal 80, the signal terminal 85, and the joint 70, and the heat sink 50 integrated with the joint 71 in the semiconductor device 17A, 17B and 17C have common structures. That is, they are common parts. The sealing resin body 20 is also a common part because the semiconductor devices 17A, 17B, 17C have the identical outlines and are formed using the common molding die 100.

Method of Manufacturing Semiconductor Device

Figure 12:
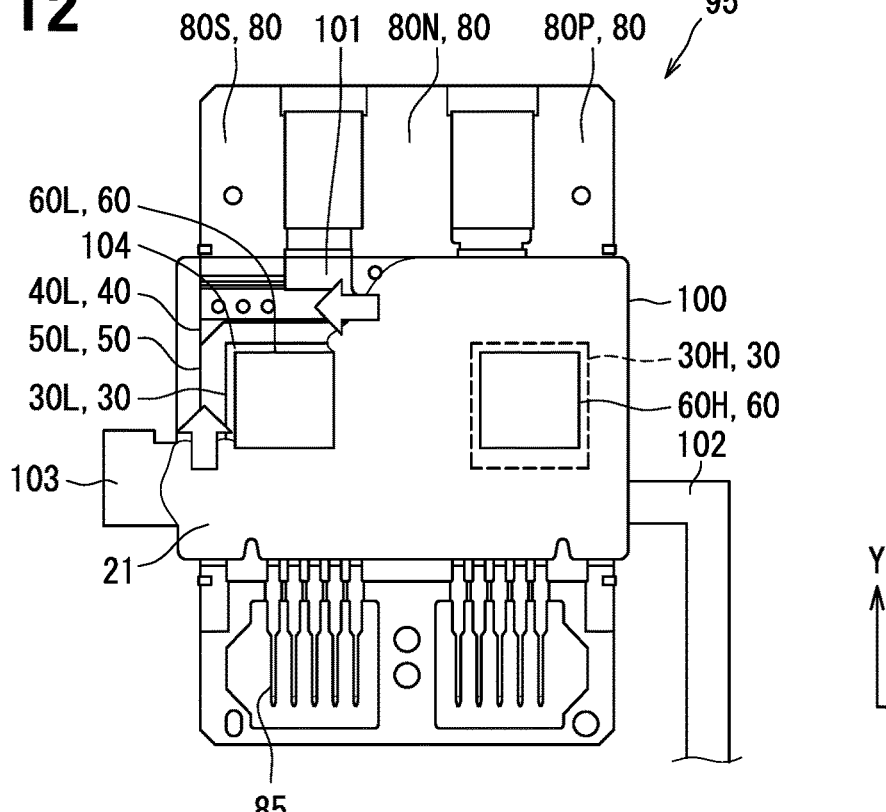
FIG. 12 is a partial cross-sectional view that illustrates formation of a sealing resin body.
Figure 13:
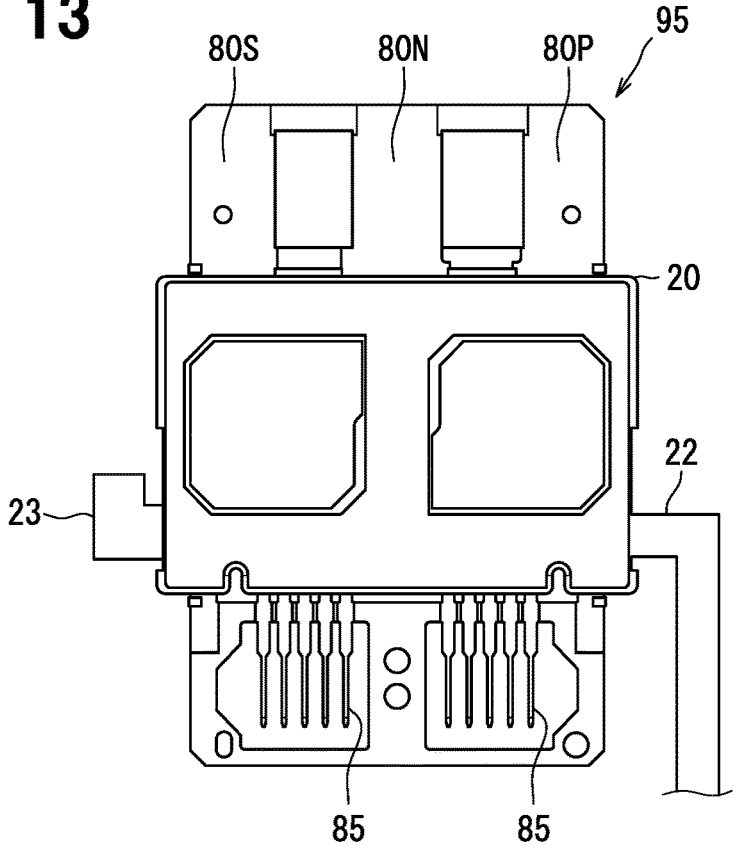
FIG. 13 is a plan view illustrating a state where the sealing resin body is formed.
Figure 13:
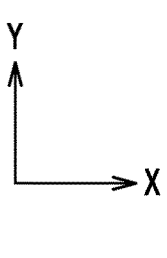
Figure 14:
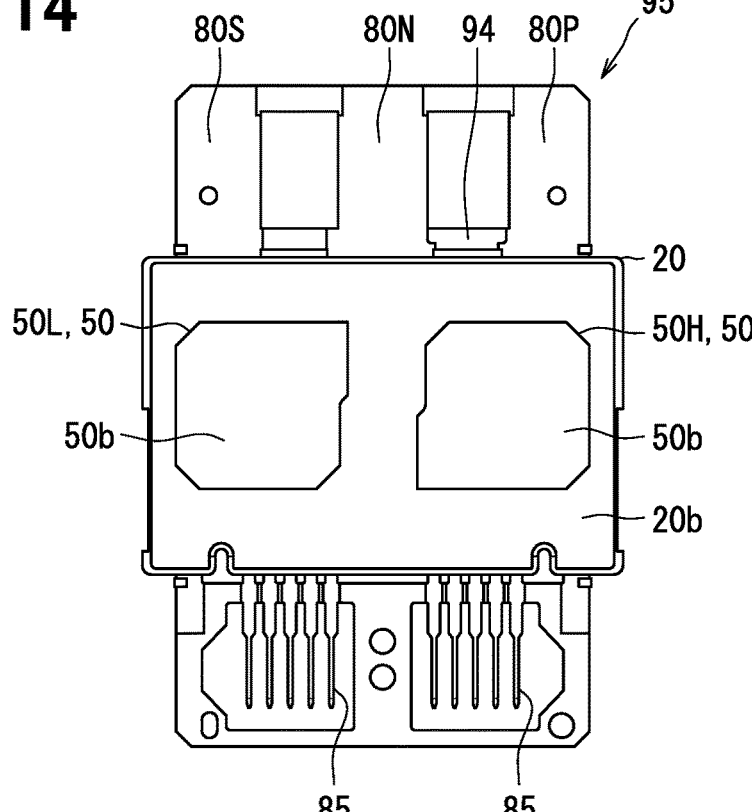
FIG. 14 is a cross-sectional view that illustrates a cutting state.
Figure 14:
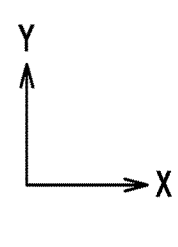

An example of the manufacturing method of the semiconductor device 17 described above will be described with reference to FIGS. 9 to 14. FIG. 12 is a partial cross-sectional view that illustrates formation of a sealing resin body 20. FIG. 12 shows an intermediate stage of resin injection. FIG. 12 shows the resin flow around the terminal. FIG. 13 is a partial cross-sectional view that illustrates formation of a sealing resin body 20. FIG. 14 is a cross-sectional view that illustrates a state after the cutting process. In the following, solder in a molten state is referred to as a molten solder.

The lead frame 95 shown in FIG. 9 is prepared. As illustrated in FIG. 10, a stacking body where the semiconductor element 30 and the terminal 60 are arranged on the heat sink 40 is formed. A molten solder 90 is applied onto the facing surface 40a of the heat sink 40, and the semiconductor element 30 is arranged on the molten solder 90 so that the collector electrode 31C faces the facing surface 40a. A molten solder 92 is applied onto the emitter electrode 31E of the semiconductor element 30, and the terminal 60 is arranged on the molten solder 92. A molten solder 91 is applied onto the terminal surface 60b of the terminal 60. Molten solders 93 and 94 are also applied onto the joint 70 and the connector 81.

The molten solders 90 to 94 can be applied using, for example, a transfer method. A stacking body is obtained by solidifying the applied molten solders 90, 92. The molten solders 90 to 94 may be solidified in the order in which they are layered, or may be solidified all at once. The connection of the bonding wire 96 may be performed after forming the stacking body, or may be performed before applying the molten solder 92 on the emitter electrode 31E while the molten solder 90 is solidified.

The semiconductor device 17 having a double-sided heat dissipation structure is sandwiched between both surfaces of the heat exchanger 180 of the cooler 18 in the Z-direction as described above. Therefore, high parallelism of the surfaces in the Z-direction and high dimensional accuracy between the surfaces are required. The solder 91 has an amount capable of absorbing the height variation in the semiconductor device 17. In other words, the solder 91 has a larger amount than the solders 90, 92. The same is applied to the solders 93, 94.

As illustrated in FIG. 11, the stacking body and the heat sink 50 are connected. Next, the heat sink 50 is placed on a pedestal (not shown) so that the facing surface 50a is located at the upper position. The stacking body is placed on the heat sink 50 and the reflow is performed, so that the terminal surface 60b of the terminal 60, in other words, the solder 91 faces the facing surface 50a. In the reflow, a load is applied in the Z-direction from the heat sink 40 side so that the semiconductor device 17 has a predetermined height. Specifically, by applying a load, a spacer (not shown) is brought into contact with both of the facing surface 40a of the heat sink 40 and a mounting surface of the pedestal. Therefore, the height of the semiconductor device 17 is set to a predetermined height.

The terminal 60 and the heat sink 50 are connected (bonded) via the solder 91 by reflow. That is, the emitter electrode 31E and the heat sink 50 are electrically connected. The solder 91 absorbs height variations due to dimensional tolerances and assembly tolerances of the elements included in the semiconductor device 17. For example, if the entire amount of the solder 91 is required to make the semiconductor device 17 have a predetermined height, the entire amount of the solder 91 remains in connection region 51 inside the groove 52. On the other hand, if the solder 91 is left over in order to obtain the predetermined height, the surplus solder 91 is accommodated in the groove 52. The joint 70 and the joint 71 continued to the heat sink 50 are connected (bonded) via the solder 93 by reflow. Also, the joint 71 continued to the heat sink 50L and the connector 81 of the negative terminal 80N are connected via the solder 94.

The sealing resin body 20 is formed by a transfer molding method. For example, the sealing resin body 20 is formed so that the heat sinks 40 and 50 are completely covered. As shown in FIG. 12, resin 21 is injected from the gate 102 into a cavity 101 of the molding die 100. The gate 102 continues to the side surface included in the cavity 101 on the semiconductor element 30H side. The gate 102 is continued to the cavity 101 in the vicinity of the connecting section between the heat sink 40H and the suspension lead 97.

The molding die 100 has a flow cavity 103. The flow cavity 103 is continued to the cavity 101 that forms the sealing resin body 20. The flow cavity 103 is continued to a side surface of the wall surface included in the cavity 101 that is opposite to the gate 102. The flow cavity 103 is provided on the signal terminal 85 side in the Y-direction.

Resin 21 wraps around the opposing region in which the semiconductor element 30 and the heat sink 50 face each other along the side surface of the terminal 60. The area around the terminal 60 (60H) closer to the gate 102 is filled first with the resin 21, and the area around the terminal 60 (60L) farther from the gate 102 is filled after with the resin 21. Around the terminal 60L, the flow of the resin in the Y-direction as indicated by a white arrow in FIG. 12 and the flow of the resin 21 in the X-direction occur. The resin 21 flows into the flow cavity 103. The flow of the resin in the −Y direction becomes slower. As a result, the resin 21 flowing in the X-direction and the resin 21 flowing in the Y-direction join at the corner portion of the semiconductor element 30L. The corner portion is at a side closer to the main terminal 80 in the Y-direction, and is at the external side in the Y-direction.

By providing the flow cavity 103, the flow velocity of the resin 21 can be adjusted, and a final junction portion 104 of the resin 21 can be provided at the corner portion of the semiconductor element 30L. Therefore, it is possible to reduce inclusion and void. Protruding portions 22, 23 derived from the gate 102 and the flow cavity 103 are continued to the sealing resin body 20 after molding as illustrated in FIG. 13. Therefore, after the molding of the sealing resin body 20, the protruding portions 22, 23 are removed (excised).

Subsequently, the cutting of the sealing resin body 20 is performed. In the present embodiment, the sealing resin body 20 is cut together with a part of the heat sinks 40, 50. As shown in FIG. 14 and the like, the respective rear surfaces 40b and 50b of the heat sinks 40 and 50 are exposed from the sealing resin body 20 by cutting. The rear surface 40b is substantially flush with the rear surface 20b, and the rear surface 50b is substantially flush with the front surface 20a.

Then, the semiconductor device 17 can be obtained by cutting an unnecessary portion of the lead frame 95 such as the tie bar 98.

However, the manufacturing method of the semiconductor device 17 is not limited to the above-described method. For example, the sealing resin body 20 may be molded in a state in which the respective rear surfaces 40b, 50b of the heat sinks 40, 50 are pressed against the wall surface of the molding die 100 and brought into a close contact with each other. In this case, at the time where the sealing resin body 20 is molded, the rear surfaces 40b, 50b are exposed from the sealing resin body 20. This also makes it possible to eliminate the cutting process.

Moreover, it is not limited to the soldered die bonding method. Solder foil or the like may be used instead of the molten solder. The semiconductor device 17 may be formed by two steps of reflow. The solders 90, 92 may be treated by reflow in the first stage to form the stacking body as described above, and the solder 91 may be treated by reflow in the second stage to connect the heat sink 50 to the stacking body. Also in this situation, it is possible to absorb the height variation of the semiconductor device 17 by the solder 91 with a larger amount.

Positional Relationship Between Terminal and Groove

Figure 15:
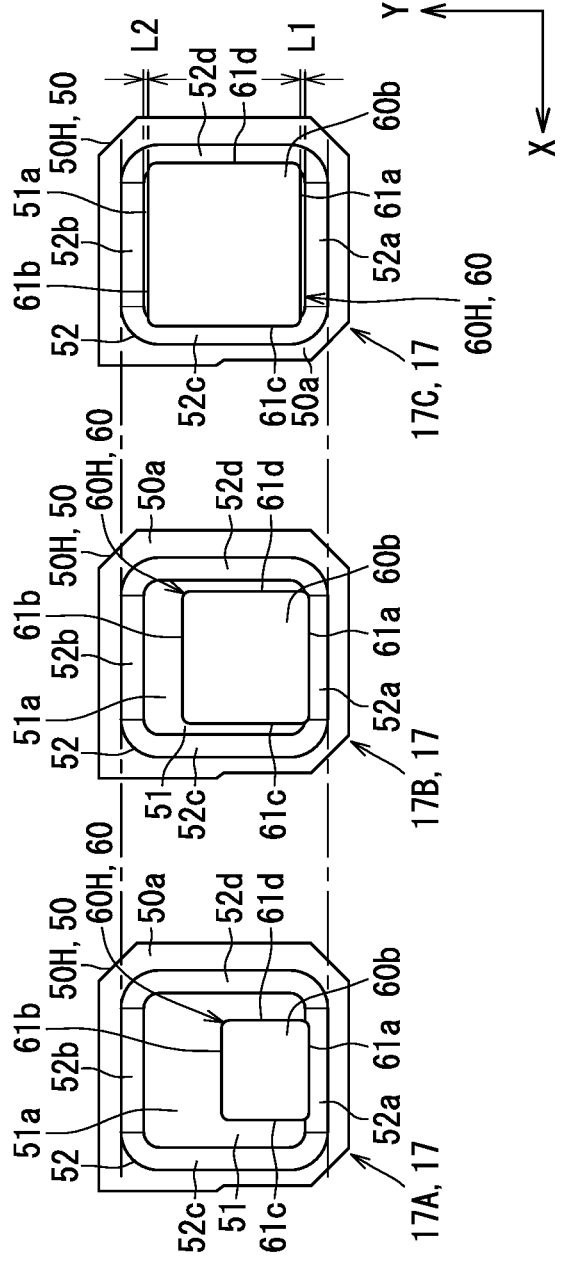
FIG. 15 is a plan view showing the positional relationship between a groove and an end face of a terminal.

The following describes the positional relation between the terminal 60 and the groove 52 of the heat sink 50 based on FIGS. 6 to 8, 10, 15. The dashed line shown in each drawing indicates the reference of the mutual positions of the semiconductor devices 17A, 17B, and 17C. FIG. 15 shows the positional relationship between the terminal 60 and the groove 52 in each of the semiconductor devices 17A, 17B, and 17C. FIG. 15 illustrates the terminal surface 60b as a surface at a side facing the heat sink 50 for illustrating positional relationship. Although FIG. 15 illustrates the heat sink 50H and the terminal 60H at the upper arm side, the same structures are respectively applied to the heat sink 50L and the terminal 60L at the lower arm side.

The terminal 60 is connected to the emitter electrode 31E of the semiconductor element 30. In the semiconductor devices 17A, 17B, and 17C in which semiconductor elements 30 (the emitter electrodes 31E) have different sizes, the terminals 60 have different sizes. In the plan view, the sizes of the respective terminals 60 satisfy the relationship of the semiconductor device 17A<the semiconductor device 17B<the semiconductor device 17C. The respective terminals 60 satisfy the relationship of the semiconductor device 17A<the semiconductor device 17B<the semiconductor device 17C.

The terminal surface 60b has a substantially rectangular shape in a plan view. As illustrated in FIG. 15, the terminal surface 60b includes two sides 61a, 61b substantially parallel to the X-direction and two sides 61c, 61d substantially parallel to the Y-direction as outer peripheral end portions. The terminal surface 60b may have rounded portions at the four corners, or may have no rounded portions. The rounded portion may also be referred to as an R-portion. In the Y-direction, the side 61a is provided on the signal terminal 85 side, that is, the pad 31P side, and the side 61b is provided on the main terminal 80 side. In the X-direction, the side 61c is provided on the joint side, and the side 61d is provided outside the side 61c in the X-direction. The X-direction corresponds to a first direction, and the Y-direction corresponds to a second direction. The side 61a corresponds to a first side, and the side 61b corresponds to a second side. The side 61c corresponds to a third side, and the side 61d corresponds to a fourth side.

The grooves 52 of the heat sink 50 are common in the semiconductor devices 17A, 17B, and 17C. That is, in the plan view, the grooves 52 are consistent. The grooves 52 are common in the semiconductor devices 17A, 17B, and 17C, and therefore the heat sinks 50 are common parts in the semiconductor devices 17A, 17B, and 17C. The size of the groove 52 is set according to the largest terminal 60 in the semiconductor devices 17A, 17B, 17C included in the power converter. In the present embodiment, the terminal 60 in the semiconductor device 17C included in the converter 6 is the largest. The size of the groove 52 is set so that the terminal 60 in the semiconductor device 17C can be accommodated in the plan view. The groove 52 is provided so as to overlap only one or only two of the four sides 61a, 61b, 61c, 61d of the terminal surface 60b in the plan view.

The groove 52 according to the present embodiment has a substantially rectangular ring shape in a plan view. The groove 52 includes two extending portions 52a, 52b extending substantially parallel to the X-direction and two extending portions 52c, 52d extending substantially parallel to the Y-direction. In the Y-direction, the extending portion 52a is provided on the signal terminal 85 side, that is, the pad 31P side, and the extending portion 52b is provided on the main terminal 80 side. In the X-direction, the extending portion 52c is provided on the joint side, and the extending portion 52d is provided outside the extending portion 52c in the X-direction. The groove 52 may have rounded portions at the four rectangular corners, or may have no rounded portions. The rounded portion may also be referred to as an R-portion.

The corresponding grooves 52 are offset with respect to the corresponding terminals 60 in the Y-direction. In the Y-direction, the distance between the side 61a at the pad 31P side and the extending portion 52a is shorter than the distance between the extending portion 52b and the side 61b on the opposite side. Thus, the groove 52 is provided so that the side 61a on the pad 31P side is closer to the groove 52 than the side 61b on the opposite side. In other words, the center of the groove 52 does not coincide with the center of the terminal 60, and is shifted away from the pad 31P. Therefore, the terminal 60 is arranged closer to the side 61a in the Y-direction.

With the above arrangement, each of the semiconductor devices 17A, 17B, 17C has a non-overlapping region 51a between the side 61b of the terminal surface 60b and the extending portion 52b of the groove 52 as a portion of the connection region 51. The terminal 60 does not overlap the non-overlapping region 51a. For example, in the semiconductor device 17C, the distance L1 between the side 61a at the pad 31P side and the extending portion 52a is shorter than the distance L2 between the extending portion 52b and the side 61b on the opposite side. The same applies to the semiconductor devices 17A, 17B.

In the semiconductor devices 17A and 17B, the extending portion 52a of the groove 52 overlaps the side 61a of the terminal surface 60b. The groove 52 does not overlap the sides 61b, 61c, 61d. The sides 61b, 61c, 61d overlap the connection region 51. In the semiconductor devices 17A, 17B included in the inverters 7, 8, the groove 52 of the heat sink 50 overlaps the side 61a of the terminal surface 60b at the pad 31P side, but does not overlap the side 61b on the opposite side. The groove 52 overlaps only the side 61a.

In the semiconductor device 17C, the extending portion 52c of the groove 52 overlaps the side 61c, and the extending portion 52d overlaps the side 61d. The groove 52 does not overlap the sides 61a, 61b. The sides 61a, 61b overlap the connection region 51. In the semiconductor device 17C included in the converter 6, the groove 52 of the heat sink 50 overlaps only the sides 61c, 61d at both ends of the terminal surface 60b in the X-direction.

Summary of First Embodiment

In the semiconductor device 17 according to the present embodiment, in the plan view, the groove 52 of the heat sink 50 is provided to overlap the outer peripheral end portion of the terminal surface 60b of the terminal 60. As a result, the surplus portion of the solder 91 easily flows into the groove 52. Therefore, the surplus portion of the solder 91 can be accommodated in the groove 52. For example, it is possible to inhibit the solder 91 from spreading to the side surface of the terminal 60 and wetting the side surface of the terminal 60.

The groove 52 is not designed for each terminal 60. The groove 52 is designed so that multiple types of the terminals 60 with different sizes can be accommodated. In particular, the groove 52 is not designed to overlap all of the four sides 61a, 61b, 61c, 61d of the terminal surface 60b of the terminal 60. The groove 52 is provided with the size to cover only one or two of the four sides 61a, 61b, 61c, 61d. As a result, it is possible to accommodate the surplus portion of the solder 91 in the groove 52 having the common structure for multiple terminals 60 with different sizes. Further, it is possible to reduce the number of components by commonly using the groove 52.

As described above, according to the semiconductor device 17 of the present embodiment, it is possible to accommodate the surplus portion of the solder 91 while reducing the number of types of the components. Thus, the cost can be reduced. Further, it is possible to commonly mold the groove 52 by commonly using the heat sink 50. Thus, the cost can be reduced.

The power conversion device 5 according to the present embodiment includes different types of the semiconductor devices 17A, 17B, 17C respectively included in different power conversion units. The semiconductor devices 17A, 17B, and 17C respectively have semiconductor elements 30 with different sizes and the terminals 60 with different sizes. On the other hand, the structure of the groove 52 is common for the semiconductor devices 17A, 17B, 17C. Further, it is possible to reduce the number of components by commonly using the groove 52. The groove 52 with a common structure is provided with the size to cover only one or two of the four sides 61a, 61b, 61c, 61d of the terminal surface 60b of the terminal 60 in each of the semiconductor devices 17A, 17B, 17C. As a result, the surplus portion of the solder 91 can be accommodated in the groove 52 in the semiconductor devices 17A, 17B, 17C with different types. As described above, it is possible to reduce the types of components for the power conversion device 5.

The power conversion device 5 includes a semiconductor devices 17A, 17B, 17C. The semiconductor device 17A is included in the inverter 7. The semiconductor device 17B is included in the inverter 8. The semiconductor device 17C is included in the converter 6. That is, three respective types of the semiconductor devices 17 (17A, 17B, and 17C) having different sizes of semiconductor elements 30 and terminals 60 are provided. With regard to three respective types of the semiconductor devices 17, one of two arbitrary types corresponds to a first semiconductor device, and the other corresponds to a second semiconductor device. A power conversion device included in the first semiconductor device corresponds to a first power conversion device, and a power conversion device included in the second semiconductor device corresponds to a second power conversion device. For example, the semiconductor device 17A corresponds to a first semiconductor device, and the semiconductor device 17C corresponds to a second semiconductor device. The inverter 7 corresponds to a first power conversion device, and the converter 6 corresponds to a second power conversion device.

Figure 16:
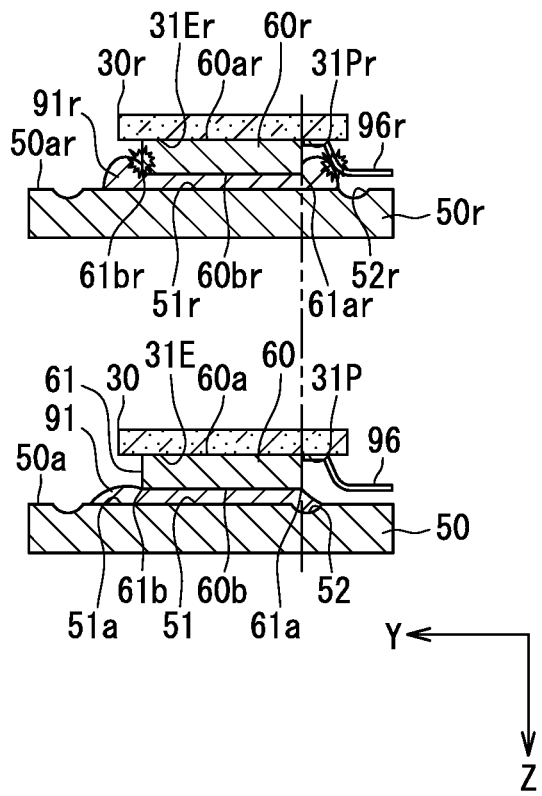
FIG. 16 is a cross-sectional view that illustrates a positional relation among the groove, the terminal and the semiconductor element.

FIG. 16 is a cross-sectional view that illustrates the effect of the arrangement of the groove 52 in the present embodiment, and also illustrates a reference example. In the reference example, the elements identical or related to the present embodiment are denoted by adding "r" to the tails of the reference numerals in the present embodiment.

In the reference example, a groove 52r does not overlap sides 61ar, 61r of a terminal surface 60br of a terminal 60r. The sides 61ar, 61br overlap a connection region 51ar. In such a structure, when the stacking body is arranged on a facing surface 50ar of a heat sink 50r and solder 91r is treated with reflow, the molten solder 91r is pushed from the stacking body side and flows around the terminal surface 60br. The groove 52r is recessed to the substantially flat connection region 51r, the solder 91 stays at the interface to some extend due to surface tension when the solder 91 spreads and wets from the connection region 51r to the groove 52r. Therefore, the solder 91 rises around the terminal surface 60br. The solder 91r is closer to the semiconductor element 30r than the terminal face 60br in the Z-direction. Therefore, it is possible that the raised portion of the solder 91r comes into contact with a bonding wire 96r. It is also possible that the solder 91r is in contact with the side surface of the terminal 60r.

In contrast, in the semiconductor devices 17A, 17B according to the present embodiment, the groove 52 overlaps the side 61a at the pad 31P side of the terminal surface 60b, and does not overlap the side 61b on the opposite side. Even though the molten solder 91 is pushed from the stacking body side and flows around the terminal surface 60b during the reflow, the molten solder 91 is accommodated in the groove 52 on the pad 31P side. Thereby, it is possible to suppress the formation of a raised portion of the solder 91 on the pad 31P side. Therefore, it is possible to inhibit the solder 91 from having a contact with the bonding wire 96.

As a portion of the solder 91 is accommodated in the groove 52, the part of the solder 91 flows around the terminal surface 60b and the solder 91 located on the connection region 51 decreases. Thereby, it is possible to suppress the formation of a raised portion of the solder 91 at a side opposite to the pad 31P. Even though the raised portion appears, the height decreases. Therefore, it is possible to inhibit the solder 91 from having a contact with the side surface of the terminal 60.

In the present embodiment, the connection region 51 includes the non-overlapping region 51a provided between the side 61b and the extending portion 52b of the groove 52. Therefore, the solder 91 pushed around the terminal surface 60b wets and spreads over the non-overlapping region 51a. Thereby, it is possible to suppress the formation of a raised portion of the solder 91.

In the semiconductor device 17C according to the present embodiment, the groove 52 overlaps the sides 61c, 61d at the both ends of the terminal surface 60b in the X-direction. The terminal 60 of the semiconductor device 17C is the largest, but the solder 91 pressed around the terminal surface 60b during reflow can be accommodated in the groove 52 (the extending portions 52c, 52d) at both sides in the X direction. Therefore, it is possible to inhibit the solder 91 from spreading to the side surface of the terminal 60 and wetting the side surface of the terminal 60.

Particularly in the present embodiment, the arrangement of the groove 52 is biased in the Y-direction with respect to the terminal 60. In particular, the distance L1 between the side 61a at the pad 31P side and the extending portion 52a is shorter than the distance L2 between the extending portion 52b and the side 61b on the opposite side. Therefore, the solder 91 pressed around the terminal surface 60b during the reflow is easily accommodated in the groove 52 at the pad 31P side. Thereby, it is possible to suppress the formation of a raised portion of the solder 91 on the pad 31P side and further inhibit the solder 91 from having a contact with the boding wire 96.

Second Embodiment

The sixth embodiment is a modification of the preceding embodiments as a basic configuration and may incorporate description of the preceding embodiments. In the preceding embodiment, the groove 52 is provided for accommodating the surplus amount of the solder 91 at the facing surface 50a of the heat sink 50. The structure may be provided for inhibiting the overflow of the solder to the outside of the groove 52.

Figure 17:
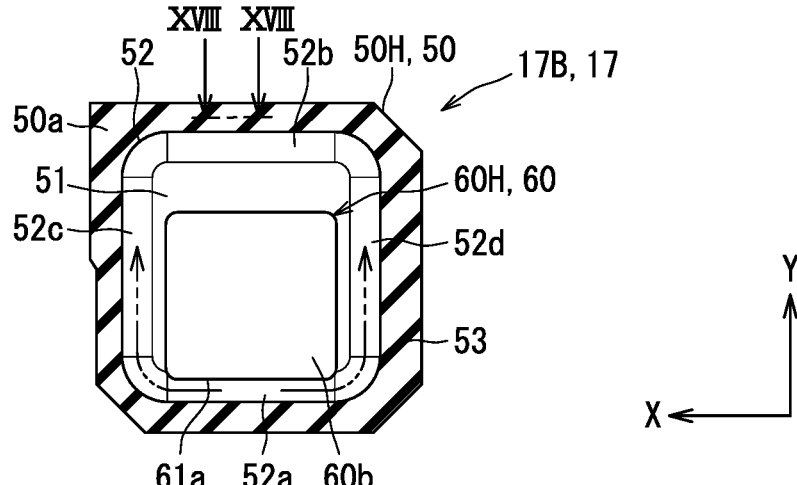
FIG. 17 is a plan view that illustrates an opposing surface of a heatsink in a semiconductor device according to a second embodiment.
Figure 18:
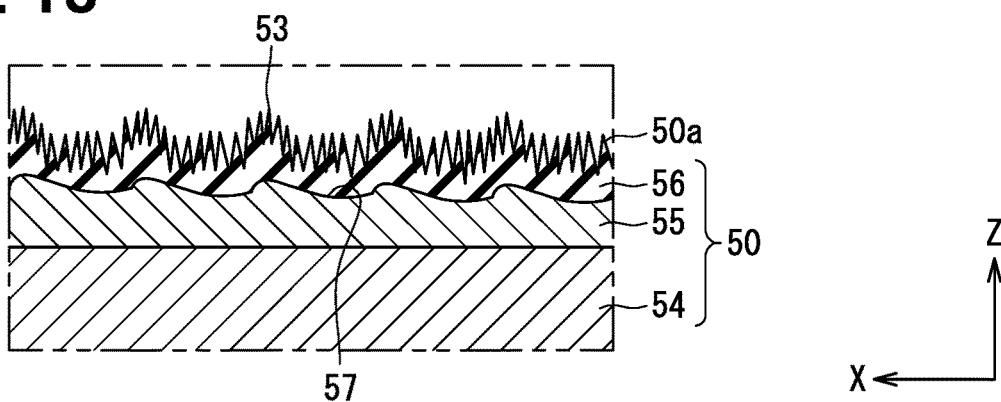
FIG. 18 is a cross sectional view taken along the line XVIII-XVIII of FIG. 17.

FIG. 17 illustrates the facing surface 50a of the heat sink 50 in the semiconductor device 17 according to a second embodiment. FIG. 17 illustrates the terminal surface 60b of the terminal 60 as similar to FIG. 15. For clarity, a roughened region 53 is hatched in FIG. 17, which is a plan view. FIG. 17 illustrates the heat sink 50H and the terminal 60H at the upper arm side of the semiconductor device 17B. However, the heat sink 50L and the terminal 60L at the lower arm side have the same structures. The heat sink 50L and the terminal 60L in the semiconductor devices 17A, 17C have the same structures. FIG. 18 is a cross-sectional view taken along line XVIII-XVIII of FIG. 17.

As illustrated in FIG. 17, the semiconductor device 17 includes the roughened region 53 at the facing surface 50a of the heat sink 50. The roughened region 53 is provided to surround the groove 52. The roughened region 53 is a region having lower wettability to the solder 91 than the portion other than the roughened region 53 at the facing surface 50a such as the connection region 51 and the groove 52. The roughened region 53 is provided substantially adjacent to the outer periphery of the groove 52. In the present embodiment, the entire region outside the groove 52 at the facing surface 50a is the roughened region 53.

As illustrated in FIG. 18, the heat sink 50 includes a base material 54, a metal film 55 and a roughened oxide film 56. The metal film 55 and the roughened oxide film 56 are provided on the surface of the base material 54. The base material 54 is the main portion of the heat sink 50. The base material 54 is formed using copper-related material. The metal film 55 is formed with the material having higher wettability to the solder 91 than the base material 54. The metal film 55 is formed at the entire region of the facing surface 50a. The roughened oxide film 56 is formed locally at the facing surface 50a.

The roughened oxide film 56 is locally formed on the metal film 55 at the facing surface 50a by irradiating laser beam to the metal film 55. The metal film 55 is provided on the surface of the base material 54 excluding, for example, the rear surface 50b. The metal film 55 has a lower base film mainly made of nickel (Ni) and an upper base film mainly made of gold (Au). In the present embodiment, an electrolysis nickel-plated film including phosphorus (P) is adopted as a lower base film. The upper base film (mainly made of Au) in a portion of the metal film 55 exposed from the roughened oxide film 56 that is in contact with the solder 91 diffuses into the solder 91 during the reflow. The upper base film (mainly made of Au) in a portion of the metal film 55 where the roughened oxide film 56 is formed is removed by the irradiation of the laser beam at the time of forming the roughened oxide film 56. The roughened oxide film 56 is an oxide film mainly made of nickel (Ni). In the present embodiment, NI$_2$O$_3$, NiO, and Ni constitute 80%, 10%, and 10%, respectively, of the roughened oxide film 56.

The metal film 55 exposed from the roughened oxide film 56 at the facing surface 50a provides a region of the heat sink 50 with high wettability to the solder 91. The metal film 55 is exposed at the connection region 51 and the groove 52. The roughened oxide film 56 is formed at the roughened region 53.

As illustrated in FIG. 18, a recess 57 is formed at the surface of the metal film 55. The recess 57 is formed by the application of the pulsed laser beam. One pulse forms a single recess 57. The roughened oxide film 56 is formed by melting, vaporizing, and vapor-depositing the surface layer portion of the metal film 55 by the irradiation of the laser beam. The roughened oxide film 56 is an oxide film derived from the metal film 55. The roughened oxide film 56 is an oxide film mainly made of the metal (Ni) as the main component of the metal film 55. The roughened oxide film 56 is formed to conform to the recesses and protrusions at the surface of the metal film 55 having the recess 57. The recesses and protrusions are formed with a smaller pitch than the width of the recess 57 at the surface of the roughened oxide film 56. In other words, the extremely fine recesses and protrusions (a roughened portion) are formed.

Method of Forming Roughened Region

The following describes a method for forming the roughened region 53. The heat sink 50 having the groove 52 is prepared. In the present embodiment, the heat sink 50 in which the joint 71 having a groove 72 are integrally connected is prepared. The heat sink 50 to which the joint 71 is connected is formed by press forging the metal plate. At this point, the heat sink 50 includes the base material 54 and the metal film 55 as described above.

Subsequently, the facing surface 50a is irradiated with the pulsed laser beam to melt and vaporize the surface of the metal film 55. The pulsed laser beam is adjusted to have the energy density larger than 0 J/cm$^2$ and equal to or smaller than 100 J/cm$^2$ and the pulsed width equal to or less than 1 microsecond. A YAG laser, a YVO$_4$ laser, a fiber laser, or the like can be used to satisfy this condition. For example, in the case of a YAG laser, the energy density may be 1 J/cm$^2$ or more. In a case of electrolysis nickel plating, the metal film 55 can be processed even at, for example, about 5 J/cm$^2$.

At this time, by moving the light source of the laser beam and the heat sink 50 relative to each other, the laser beam is scanned and sequentially irradiated to multiple positions. The recess 57 is formed at the surface of the metal film 55 by irradiating the laser beam to melt and vaporize the surface of the metal film 55. The average thickness of a portion of the metal film 55 irradiated with the laser beam is thinner than the average thickness of the portion of the metal film not irradiated with the laser beam. Multiple recesses 57 formed corresponding to the spots of the laser beam are continuous and have, for example, a scaly shape. A spot is an irradiation range by one pulse.

For example, the laser beam is scanned such that the laser beam spots adjacent to each other in the X-direction partially overlap to each other and the laser beam sports that are adjacent to each other in the Y-direction partially overlap to each other. At this time, the laser beam is scanned in the X-direction from the reference coordinate in the X-direction to irradiate the first row of the irradiation. After the first row of the irradiation is completed, the second row of the irradiation may be performed by shifting the coordinates in the Y-direction and scanning the laser beam from the reference coordinates in the X-direction.

Figure 19:
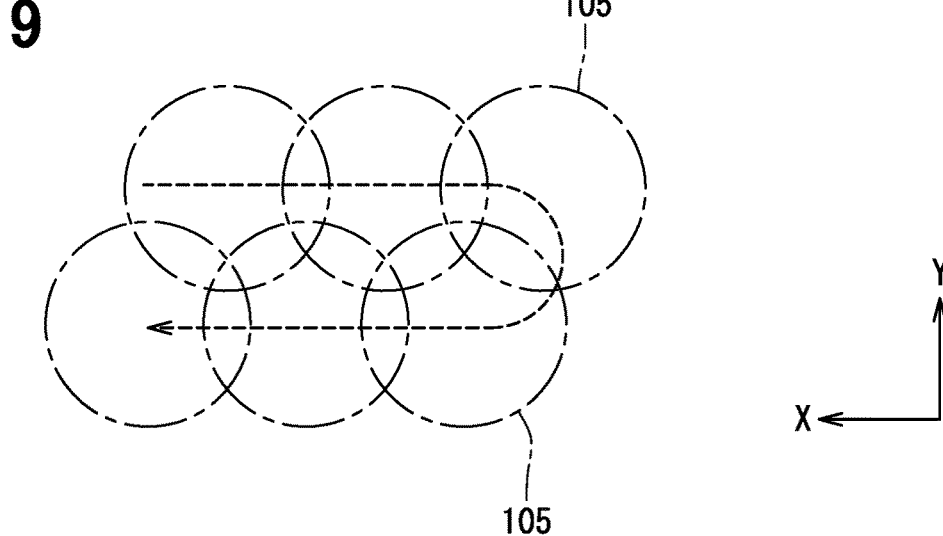
FIG. 19 illustrates scanning of laser beam.

In the present embodiment, as illustrated in FIG. 19, after the first row of the irradiation is completed, the laser beam is scanned in the opposite direction in the X-direction, and the second row of the irradiation is performed. The return scanning is performed without waiting for the return to the reference coordinates. Therefore, it is possible to shorten the irradiation time of the laser beam. The spots 105 in the first row and the spots 105 in the second row are shifted in the X-direction. In particular, in the X-direction, the respective positions of the spots 105 are shifted, such that the position of the center between the adjacent two spots 105 in the first row substantially coincides with the position of the center of the spot 105 in the second row.

Then, the molten portion of the metal film 55 is solidified. In particular, the metal film 55 which is molten and vaporized is vapor-deposited on a portion irradiated with the laser beam and its surrounding portion. By vapor-depositing the metal film 55 which is melted and vaporized as described above, the roughened oxide film 56 is formed on the surface of the metal film 55. As described above, with the staggered arrangement of the spots 105, the formation unevenness of the roughened oxide film 56 can be reduced at the entire region of the roughened region 53. In other words, the film thickness of the roughened oxide film 56 per unit area can be substantially uniform over the entire region of the roughened region 53. The heat sink 50 is prepared as described above.

Summary of Second Embodiment

According to the present embodiment, the roughened region 53 is provided to surround the groove 52. The roughened region 53 is formed by locally irradiating the metal film 55 with high wettability to the solder 91 with a laser beam to form the roughened oxide film 56. The oxide film (the roughened oxide film 56) has lower wettability to the solder 91 as compared with the metal film 55. Since the roughened oxide film 56 has fine protrusions and recesses at the surface, the contact area with the solder 91 is reduced and a part of the solder 91 is formed into a spherical shape due to surface tension. In other words, the contact angle becomes large. As a result, the wettability of the roughened oxide film 56 to the solder 91 is low. Thus, the roughened oxide film 56 can prevent the solder 91 from wetting and spreading outside the groove 52.

In the present embodiment, the groove 52 is provided with the size to cover only one or two of the four sides 61*a*, 61*b*, 61*c*, 61*d* of the terminal surface 60*b* of the terminal 60 as similar to the preceding embodiment. For example, in the structure in which the groove 52 overlaps only the side 61*a*, even though the surplus portion of the solder 91 cannot be accommodated or absorbed by only the extending portion 52*a* overlapping the side 61*a*, the roughened region 53 (the roughened oxide film 56) can inhibit the spreading and wetting to the outside of the groove 52. As a result, the surplus portion of the solder 91 wets and spreads in the groove 52 toward the extending portions 52*c*, 52*d* as indicated by the two-dotted chain line arrow in FIG. 17. It is possible to prevent the solder 91 from overflowing to outside of the groove 52 in the structure where the heat sink 50 is a common part by commonly using the groove 52. The same applies to the structure in which the groove 52 overlaps only the sides 61*c* and 61*d*.

In the formation of the roughened oxide film 56, since the laser beam is adopted as described above, it is easier to perform patterning of the connection region 51 and the groove 52 as the high wettability region and patterning of the roughened region 53 as the low wettability region. Fine protrusions and recesses are formed at the surface of the roughened oxide film 56, and the sealing resin body 20 is entangled with the protrusions and recesses. Therefore, the anchor effect can be generated. Also, the contact area with the sealing resin body 20 increases. Therefore, the sealing resin body 20 can be brought into a close contact with a region of the heat sink 50 where the roughened oxide film 56 is provided, in other words, the roughened region 53.

Modifications

The present embodiment describes that the entire region outside the groove 52 is set as the roughened region 53 at the facing surface 50*a* of the heat sink 50. The roughened region 53 may be provided at a portion of the region outside the groove 52 to surround the groove 52.

Figure 20:
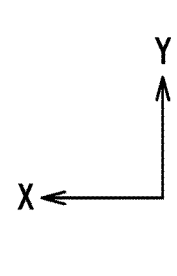
FIG. 20 is a plan view illustrating a modified example.

For example, as in the modification illustrated in FIG. 20, the region outside the groove 52 excluding an edge region 58 may be set as the roughened region 53. For clarity, the roughened region 53 is hatched in FIG. 20. The edge region 58 is a region including the outer peripheral edge of the facing surface 50*a*. The heat sink 50 is positioned by a positioning jig 106 at the time of irradiating the laser beam. The positioning jig 106 presses the side surface of the heat sink 50. Therefore, when the roughened region 53 is provided up to the outer peripheral end, the positioning jig 106 may be scraped by the laser beam. Thus, a decrease in positioning precision may occur.

A drooped side is formed by press forging in a predetermined range from the outer peripheral end at the facing surface 50*a*. The drooped side is rounded and not flat. It is generally difficult to inspect the drooped side in an appearance inspection (for example, binarization processing) using an imaging device, and the drooped side is generally excluded from the inspection region. Therefore, when the edge region 58 is set within the range of the drooped side, it is possible to suppress the influence on the positioning jig 106 while ensuring the quality.

Although illustration is omitted, a roughened region may be provided on the surface of the joint 71 on which the groove 72 is formed. The roughened region is formed by the irradiation of the laser beam as similar to the roughened region 53. The roughened region is provided outside the groove to surround the groove 72 at the joint 71. The roughened region of the joint 71 may be provided to be continuous with the roughened region 53 of the heat sink 50.

Figure 21:
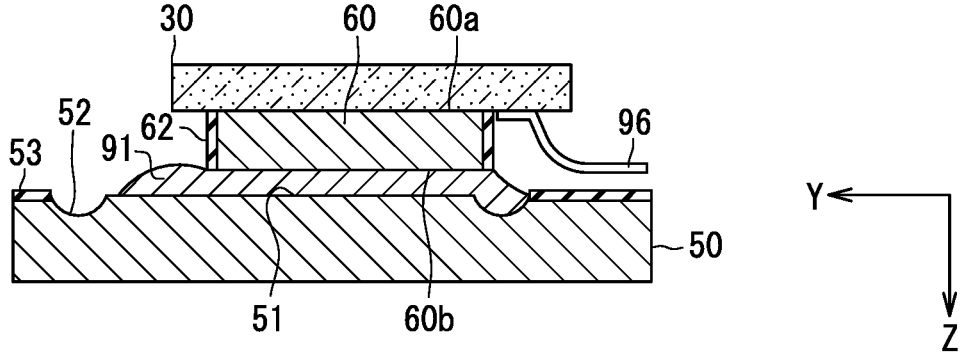
FIG. 21 is a cross-sectional view illustrating the modified example.

As in the modification shown in FIG. 21, in addition to the roughened region 53 of the heat sink 50, a roughened region 62 may be provided on the side surface of the terminal 60. In FIG. 21, the roughened region 62 is provided on almost the entire side surface of the terminal 60. The roughened region 62 is formed by the irradiation of the laser beam as similar to the roughened region 53. Although illustration is omitted, the terminal 60 also has a base material, a metal film provided on the base material, and a roughened oxide film. Therefore, it is possible to inhibit the solder 91 from spreading to the side surface of the terminal 60 and wetting the side surface of the terminal 60 by having the roughened region 62 at the side surface of the terminal 60. That is, it is possible to inhibit the solder 91 from flowing into the soldered joint portion of the emitter electrode 31E through the side surface of the terminal 60. Therefore, it is possible to suppress a decrease in the connection reliability of the soldered joint portion of the emitter electrode 31E.

Figure 22:
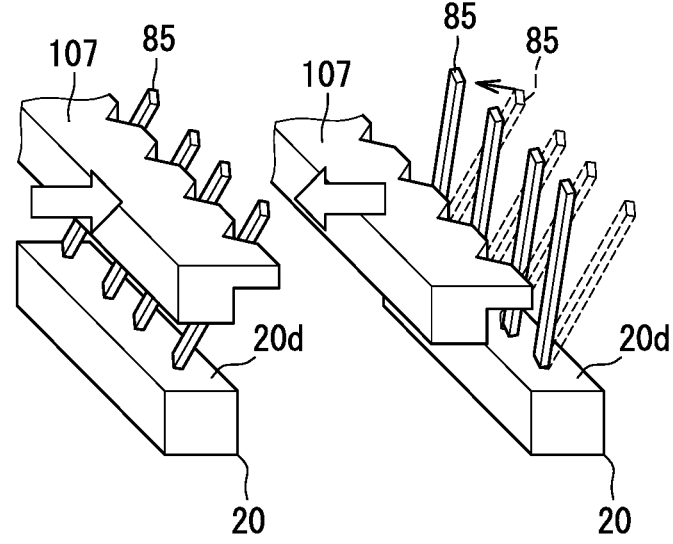
FIG. 22 illustrates correction of a signal terminal.

As described above, the signal terminal 85 is inserted into the circuit board 19, and mounts on the circuit board 19. Therefore, the position of the signal terminal 85, in particular, the position of the tip to be inserted is corrected by a correcting jig 107 shown in, for example, FIG. 22. In particular, the correcting jig 107 is pressed near the tip of the signal terminal 85 to apply a load to the signal terminal 85 to deform the signal terminal 85. After that, the signal terminal 85 exerts spring back to release the load applied by the correcting jig 107. As a result, the respective tip positions of the signal terminals 85 are corrected.

Figure 23:
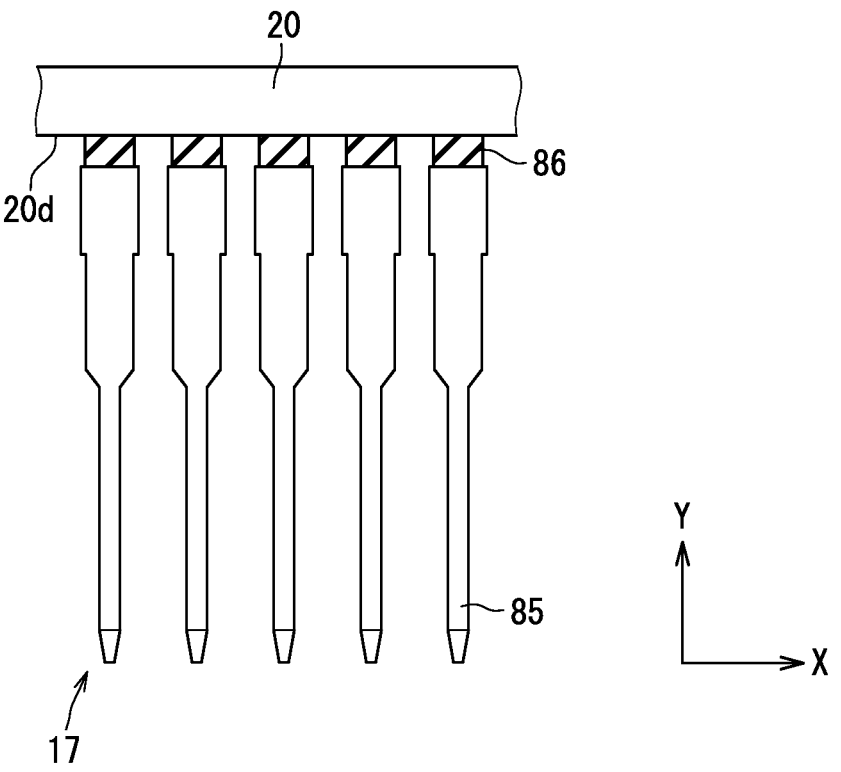
FIG. 23 is a plan view illustrating the modified example.

In the structure for correcting the position of the signal terminal 85, as in the modification illustrated in FIG. 23, it is possible to provide a roughened region 86 at the root portion of the outer load portion of the signal terminal 85. For clarity, the roughened region 86 is hatched in FIG. 23. The roughened region 86 is formed by the irradiation of the laser beam as similar to the roughened region 53. Although illustration is omitted, the signal terminal 85 also has a base material, a metal film provided on the base material, and a roughened oxide film. In the roughened region 86, the film thickness of the metal film (nickel plating film) is thinner than the non-irradiated area. Therefore, when the signal terminal 85 is corrected, the roughened region 86 becomes a starting point of plating cracks. Therefore, the signal terminal 85 is deformed starting from the roughened region 86. Since the starting point is stabilized as described above, it is possible to reduce the variation in the tip position after the correction.

The roughened region 86 is not limited to the root portion of the outer lead portion. The roughened region 86 may be provided from the outer lead portion to the inner lead portion. In the inner lead portion, the roughened region 86 is formed avoiding the connecting portion of the bonding wire 96. By providing the roughened region 86 at the inner lead portion, it is possible to enhance the adhesion of the sealing resin body 20.

Third Embodiment

The present embodiment is a modification of the preceding embodiments as a basic configuration and may incorporate description of the preceding embodiments. In the preceding embodiments, the protective film of the semiconductor element is not particularly mentioned. In contrast, the structure of suppressing peeling of the sealing resin body from the protective film may be adopted.

Figure 24:
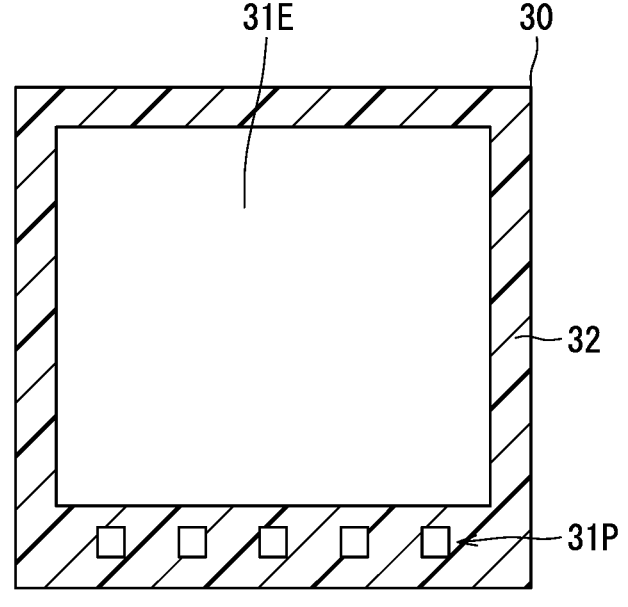
FIG. 24 is a plan view illustrating a rear surface of a semiconductor element in a semiconductor device according to a third embodiment.
Figure 24:
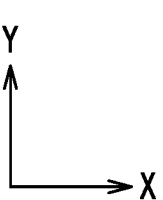

FIG. 24 is a plan view that illustrates the rear surface side of the semiconductor element 30 in the semiconductor device 17 according to the present embodiment. The semiconductor element 30 includes the protective film 32. For clarity, a protective film 32 is illustrated with hatching in FIG. 24 as a plan view. The constituent material of the protective film 32 is, for example, polyimide. The protective film 32 is provided around the emitter electrode 31E and the pad 31P on the rear surface of the semiconductor substrate. The emitter electrode 31E and the pad 31P are exposed from an aperture of the protective film 32. The protective film 32 is an insulating film that is provided at the emitter electrode 31E side and forms a part of the surface of the semiconductor element 30. As described above, the solder 92 is connected to the emitter electrode 31E. The bonding wire 96 is connected to the pad 31P. The sealing resin body 20 adheres to the protective film 32.

For example, if the sealing resin body 20 is peeled off from the protective film 32 at the surrounding of the pad 31P, it is possible that a stress is applied to the bonding wire 96 and the bonding wire 96 may break. Therefore, the protective film 32 enhances the adhesion with the sealing resin body 20.

Figure 25:
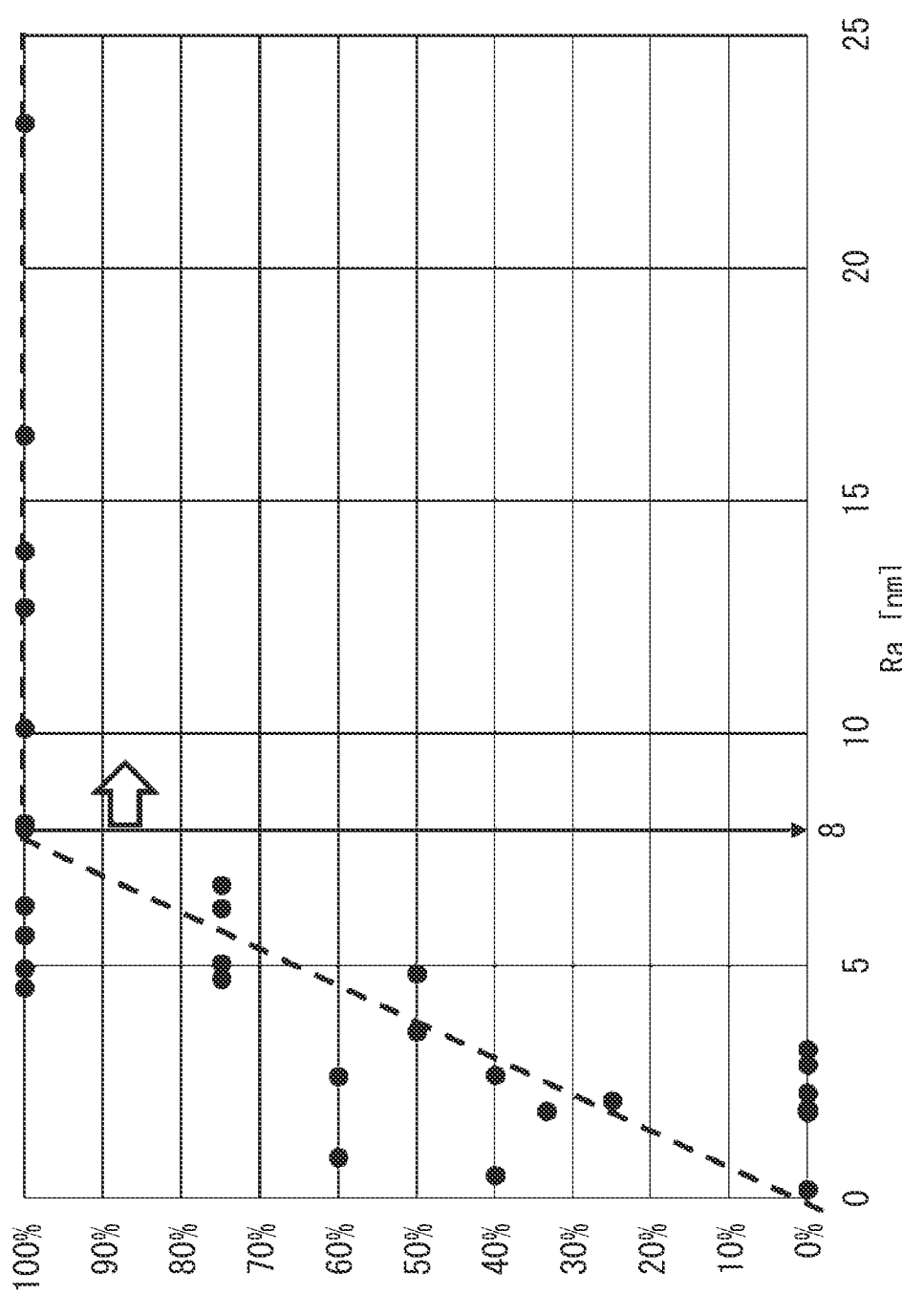
FIG. 25 illustrates the relationship between the arithmetic mean roughness Ra of a protective film surface and a bulk fracture rate.

FIG. 25 illustrates the relationship between the arithmetic mean roughness Ra of the surface of the protective film 32 and a bulk fracture rate. FIG. 25 shows the results of an experiment. As shown in FIG. 25, when the arithmetic mean roughness Ra was 8 nanometers or more, bulk fracture occurred with a probability of 100%. On the other hand, when the thickness is less than 8 nanometers, interfacial fracture or composite fracture including the interfacial fracture and the bulk fracture is observed, and the bulk fracture rate is less than 100%. Based on the knowledge, in the present embodiment, the surface of the protective film 32 is intentionally roughened so that the arithmetic mean roughness Ra is 8 nanometers or more.

The surface of the protective film 32 can be roughened by, for example, ashing. Ashing is a process of irradiating a resin surface with oxygen plasma in a high-energy state, bonding with carbon constituting the resin, and vaporizing and decomposing as $CO_2$ (ashing).

Summary of Third Embodiment

The semiconductor element 30 according to the present embodiment has the protective film 32 having the surface arithmetic mean roughness Ra of 8 nanometers or more. Therefore, the adhesion between the protective film 32 and the sealing resin body 20 enhances in the semiconductor device 17. Therefore, the sealing resin body 20 is hardly to be peeled off from the protective film 32. For example, it is possible to suppress peeling of the sealing resin body 20 around the pad 31P, and it is possible to suppress the breakage of the bonding wire 96.

Although the above description mentions that the surface of the protective film 32 is roughened by ashing, it is not limited to the above example. For example, plasma species other than oxygen may be used, such as argon and nitrogen.

Although the example of polyimide is described as the protective film 32, it is not limited to polyimide. An insulating film other than polyimide, for example, a silicon oxide film, a silicon nitride film, and a Phospho Silicate Glass (PSG) film may be adopted as the protective film 32. By intentionally roughening the surface of these insulating films, it is possible to suppress the peeling of the sealing resin body 20.

Other Embodiments

The disclosure in this specification and drawings is not limited to the exemplified embodiments. The disclosure encompasses the illustrated embodiments and modifications by those skilled in the art based thereon. For example, the disclosure is not limited to the combinations of components and/or elements shown in the embodiments. The disclosure may be implemented in various combinations. The disclosure may have additional parts that may be added to the embodiment. The disclosure encompasses omissions of parts and/or elements of the embodiments. The disclosure encompasses replacement or combination of parts and/or elements between one embodiment and another. The disclosed technical scope is not limited to the description of the embodiments. It should be understood that some disclosed technical ranges are indicated by description in the present disclosure, and includes every modification within the equivalent meaning and the scope of description in the present disclosure.

The disclosure in the specification, drawings and the like is not limited by the description of the claims. The disclosures in the specification, the drawings, and the like encompass the technical ideas described in the claims, and further extend to a wider variety of technical ideas than those in the claims. Therefore, various technical ideas can be extracted from the disclosure of the specification, the drawings and the like without being limited to the description of the claims.

When an element or a layer is described as "disposed above" or "connected", the element or the layer may be directly disposed above or connected to another element or another layer, or an intervening element or an intervening layer may be present therebetween. In contrast, when an element or a layer is described as "disposed directly above" or "directly connected", an intervening element or an intervening layer is not present. Other terms used to describe the relationships between elements (for example, "between" vs. "directly between", and "adjacent" vs. "directly adjacent") should be interpreted similarly. As used herein, the term "and/or" includes any combination and all combinations relating to one or more of the related listed items. For example, the term A and/or B includes only A, only B, or both A and B.

Spatial relative terms "inside", "outside", "back (rear)", "bottom", "low", "top", "high", "upper", "lower", etc. are used herein to facilitate the description that describes relationships between one element or feature and another element or feature. Spatial relative terms can be intended to include different orientations of a device in use or operation, in addition to the orientations depicted in the drawings. For example, when the device in the figure is flipped over, an element described as "below" or "directly below" another element or feature is directed "above" the other element or feature. Therefore, the term "below" can include both above and below. The device may be oriented in the other direction (rotated 90 degrees or in any other direction) and the spatially relative terms used herein are interpreted accordingly.

The control circuit 9 and the drive circuit 10 are provided by a control system including at least one computer. The computer includes at least one processor (hardware processor) that is hardware. The hardware processor can be provided by the following (i), (ii), or (iii).

(i) The hardware processor may be a hardware logic circuit. In this case, the computer is provided by a digital circuit including a number of programmed logic units (gate circuits). The digital circuit may include a memory that stores programs and/or data. The computer may be provided by analog circuit. A computer may be provided by a combination of a digital circuit and an analog circuit.

(ii) The hardware processor may be at least one processor core that executes a program stored in at least one memory. In this case, the computer is provided by at least one memory and at least one processor core. The processor core is called, for example, a CPU. The memory is also called a storage medium. The memory is a non-transitory and tangible storage medium that non-transitorily stores "program and/or data" readable by the processor.

(iii) The hardware processor may be a combination of the above (i) and the above (ii). (i) and (ii) are disposed on different chips or on a common chip.

That is, measures and/or functions provided by the control sections can be provided by hardware only, software only, or a combination of hardware and software.

The example in which the power conversion device 5 includes the control circuit 9 is shown, but the present embodiment may not be limited thereto. For example, by giving the function of the control circuit 9 to the upper ECU, the configuration may not include the control circuit 9. An example in which the drive circuit 10 is provided for each arm has been shown, but the present embodiment may not be limited to this. For example, one drive circuit 10 may be provided for one vertical arm circuit.

The vehicle drive system 1 is not limited to the above structure described in the embodiments. Although the present disclosure describes that two motor generators 3, 4 are provided, it is not limited to the example described in the present disclosure. Although the above description mentions that the power conversion device 5 includes the converter 6 and the inverters 7, 8 as a power conversion device. However, it is not limited to the above example. Multiple power conversion devices may be included. Alternatively, a structure with only multiple inverters may also be adopted. A structure with one inverter and a converter may also be adopted. The above description mentions that the power conversion device 5 includes the semiconductor devices 17A, 17B, 17C. However, it is not limited to the above example. The number of layers in the semiconductor device 17 in the semiconductor module 16 is not limited to the above example.

The above description mentions that the semiconductor element 30 includes the RC-IGBT element. However, it is not limited to the above example. The switching elements Q1, Q2, Q3 and the diodes D1, D2, D3 may be provided as separate chips (separate semiconductor elements). Although the above description describes the switching elements Q1, Q2, Q3 as IGBTs, it is not limited to the above example. For example, a MOSFET may be adopted.

A structure with multiple semiconductor elements 30H are connected in parallel to form one upper arm may be provided. A structure with multiple semiconductor elements 30L are connected in parallel to form one lower arm may be provided.

The above description states that the respective surfaces 40b, 50b of the heat sinks 40, 50 are exposed from the sealing resin body 20. However, it is not limited to the above example. At least one of the rear surfaces 40b, 50b may be covered by the sealing resin body 20. At least one of the rear surfaces 40b, 50b may be covered by another insulating member (not shown) different from the sealing resin body 20. The above description mentions that the semiconductor device 17 includes the sealing resin body 20. However, it is not limited to the above example. A structure without the sealing resin body 20 may be adopted.

The above description mentions that the semiconductor device 17 includes multiple semiconductor elements 30 included in the vertical arm circuit for one phase. However, it is not limited to the above example. Only the semiconductor element 30 for one arm may also be provided. The semiconductor device 17 may include, for example, the semiconductor element 30 included in one arm, a pair of the heat sinks 40, 50 arranged to sandwich the semiconductor element 30, and the terminal 60 interposed between the semiconductor element 30 and the heat sink 50. In addition, the semiconductor elements included in the vertical arm circuit for plural phases may be provided as a single package.

The above description mentions that the signal terminal 85 is connected to the pad 31P through the bonding wire 96. However, it is not limited to the above example.

The present description describes that the groove 72 is provided for the joint 71. However, it is not limited to the above example. A structure without the groove 72 may also be provided.

The present disclosure has been described based on examples, but it is understood that the present disclosure is not limited to the examples or structures. The present disclosure encompasses various modifications and variations within the scope of equivalents. In addition, various combinations and configurations, as well as other combinations and configurations that include only one element, more, or less, fall within the scope and spirit of the present disclosure.

What is claimed is:

1. A semiconductor device comprising:
a semiconductor element including
a first main electrode at a first surface of the semiconductor element, and
a second main electrode at a second surface of the semiconductor element on a side opposite from the first surface in a thickness direction of the semiconductor element;
a first wiring member connected to the first main electrode;
a terminal having a first terminal surface connected to the second main electrode and a second terminal surface on a side opposite from the first terminal surface in the thickness direction, the second terminal surface having four sides, two of the four sides being parallel to a first direction perpendicular to the thickness direction, other two of the four sides being parallel to a second direction perpendicular to the thickness direction and the first direction; and
a second wiring member connected to the second terminal surface through solder, the second wiring member having a single connection region and a single groove at a facing surface facing the terminal, the single connection region connected to the terminal, the single groove accommodating a surplus portion of the solder, wherein the single groove surrounds only the single connection region, and wherein, in a plan view of the single groove in the thickness direction, the single groove overlaps one or two of the four sides of the second terminal surface.

2. The semiconductor device according to claim 1,
wherein the semiconductor element includes a pad disposed at the second surface and aligned with the second main electrode in the second direction,
wherein the other two of the four sides are respectively a first side and a second side, and
wherein the single groove is disposed closer to the terminal in the second direction, and the single groove overlaps the first side and does not overlap the second side on a side opposite from the first side.

3. The semiconductor device according to claim 2,
wherein the single connection groove includes a non-overlapping region as a portion between the second side of the terminal and the single groove, and the non-overlapping region does not overlap the terminal in the plan view, and
wherein the solder is disposed at the non-overlapping region.

4. The semiconductor device according to claim 1,
wherein the semiconductor element includes a pad disposed at the second surface and aligned with the second main electrode in the second direction,
wherein the two of the four sides at both ends of the second terminal surface in the first direction are respectively a third side and a fourth side, and
wherein the single groove overlaps the third side and the fourth side.

5. The semiconductor device according to claim 4,
wherein the single groove is disposed to be closer to the terminal in the second direction,
wherein the other two of the four sides are respectively
    a first side at the second terminal surface on a side closer to the pad, and
    a second side on a side opposite from the first side, and
wherein the single groove is closer to the first side than the second side in the second direction.

6. The semiconductor device according to claim 1,
wherein the second wiring member further includes:
    a base material;
    a metal film disposed at a surface of the base material, and made of a metal as a main component; and
    a roughened oxide film being an oxide of a metal identical to the main component of the metal film, the roughened oxide film having a continuous surface with protrusions and recessions, and
wherein the roughened oxide film surrounds the facing surface.

7. A power converter comprising:
a first semiconductor device included in a first power conversion device; and
a second semiconductor device included in a second power conversion device,
wherein each of the first semiconductor device and the second semiconductor device includes:
    a semiconductor element including
        a first main electrode at a first surface of each of the semiconductor elements, and
        a second main electrode at a second surface of the semiconductor element on a side opposite from the first surface in a thickness direction of the semiconductor element;
    a first wiring member connected to the first main electrode;
    a terminal having a first terminal surface connected to the second main electrode and a second terminal surface on a side opposite from the first terminal surface in the thickness direction, the second terminal surface having four sides, two of the four sides being parallel to a first direction intersecting the thickness direction, other two of the four sides being parallel to a second direction perpendicular to the thickness direction and the first direction; and
    a second wiring member connected to the second terminal surface through solder, the second wiring member having a single connection region and a single groove at a facing surface facing the terminal, the single connection region connected to the terminal, the single groove accommodating a surplus portion of the solder,
wherein a size of the terminal included in the first semiconductor device is different from a size of the terminal included in the second semiconductor device in a plan view of the first semiconductor device and the second semiconductor device in the thickness direction, and a size of the single groove included in the first semiconductor device is identical to a size of the single groove included in the second semiconductor device,
wherein, in each of the first semiconductor device and the second semiconductor device, the single groove surrounds only the single connection region, and
wherein, in a plan view of the single groove in the thickness direction, the single groove in each of the first semiconductor device and the second semiconductor device overlaps one or two of the four sides of the second terminal surface.

\* \* \* \* \*